(12) United States Patent
Yamashita

(10) Patent No.: US 8,823,847 B2
(45) Date of Patent: Sep. 2, 2014

(54) SOLID-STATE IMAGING DEVICE AND MANUFACTURING METHOD THEREOF

(71) Applicant: Hirofumi Yamashita, Kawasaki (JP)

(72) Inventor: Hirofumi Yamashita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/705,285

(22) Filed: Dec. 5, 2012

(65) Prior Publication Data

US 2013/0119238 A1 May 16, 2013

Related U.S. Application Data

(63) Continuation of application No. 12/869,799, filed on Aug. 27, 2010, now Pat. No. 8,390,707, which is a continuation of application No. PCT/JP2009/053614, filed on Feb. 20, 2009.

(30) Foreign Application Priority Data

Feb. 28, 2008 (JP) ................................ 2008-048412

(51) Int. Cl.
*H04N 3/14* (2006.01)
*H04N 5/335* (2011.01)

(52) U.S. Cl.
USPC ........... 348/294; 348/298; 348/302; 348/308; 348/312

(58) Field of Classification Search
USPC ......... 348/294–324; 250/208.1; 257/290–292
See application file for complete search history.

(56) References Cited

U.S. PATENT DOCUMENTS

| 7,319,217 B2* | 1/2008 | Yoshihara et al. ......... 250/208.1 |
| 2004/0222358 A1 | 11/2004 | Bui et al. |
| 2005/0179053 A1* | 8/2005 | Ezaki et al. .................... 257/189 |
| 2006/0043519 A1 | 3/2006 | Ezaki |
| 2006/0082669 A1 | 4/2006 | Inoue et al. |
| 2006/0094151 A1 | 5/2006 | Sumi |

(Continued)

FOREIGN PATENT DOCUMENTS

| DE | 195 28 573 A1 | 2/1997 |
| JP | 2-143558 | 6/1990 |

(Continued)

OTHER PUBLICATIONS

Notification of Reasons for Rejection issued Nov. 26, 2013 in Japanese Patent Application No. 2012-232737 (with English translation).

(Continued)

*Primary Examiner* — Yogesh Aggarwal
(74) *Attorney, Agent, or Firm* — Oblon, Spivak, McClelland, Maier & Neustadt, L.L.P.

(57) ABSTRACT

According to one embodiment, a solid-state imaging device includes a pixel region which is configured such that a photoelectric conversion unit and a signal scanning circuit unit are included in a semiconductor substrate, and a matrix of unit pixels is disposed, and a driving circuit region which is configured such that a device driving circuit for driving the signal scanning circuit unit is disposed on the semiconductor substrate, wherein the photoelectric conversion unit is provided on a back surface side of the semiconductor substrate, which is opposite to a front surface of the semiconductor substrate where the signal scanning circuit unit is formed, and the unit pixel includes an insulation film which is provided in a manner to surround a boundary part with the unit pixel that neighbors and defines a device isolation region.

17 Claims, 18 Drawing Sheets

(56) References Cited

U.S. PATENT DOCUMENTS

| | | |
|---|---|---|
| 2006/0180885 A1 | 8/2006 | Rhodes |
| 2007/0045513 A1 | 3/2007 | Lee et al. |
| 2011/0042552 A1 | 2/2011 | Furuya et al. |

FOREIGN PATENT DOCUMENTS

| | | |
|---|---|---|
| JP | 2005-142221 | 6/2005 |
| JP | 2005-294647 | 10/2005 |
| JP | 2005-294705 | 10/2005 |
| JP | 2006-32497 | 2/2006 |
| JP | 2006-128392 | 5/2006 |
| JP | 2006-128433 | 5/2006 |
| JP | 2006-191100 | 7/2006 |
| JP | 2007-184603 | 7/2007 |
| JP | 2007-221134 | 8/2007 |
| JP | 2007-258684 | 10/2007 |
| JP | 2007-323390 | 12/2007 |
| JP | 2008-300614 | 12/2008 |
| JP | 2009-10219 | 1/2009 |
| JP | 2009-182223 | 8/2009 |

OTHER PUBLICATIONS

Extended European Search Report issued Dec. 9, 2011 in Patent Application No. 09715460.3.

Office Action issued Jul. 31, 2012 in Taiwanese Patent Application No. 098103490.

Office Action issued Jun. 12, 2012 in Japanese Patent Application No. 2008-048412 (w/English translation).

Office Action issued Aug. 21, 2012 in Japanese Application No. 2008-048412 filed Feb. 28, 2008 (w/English translation).

* cited by examiner

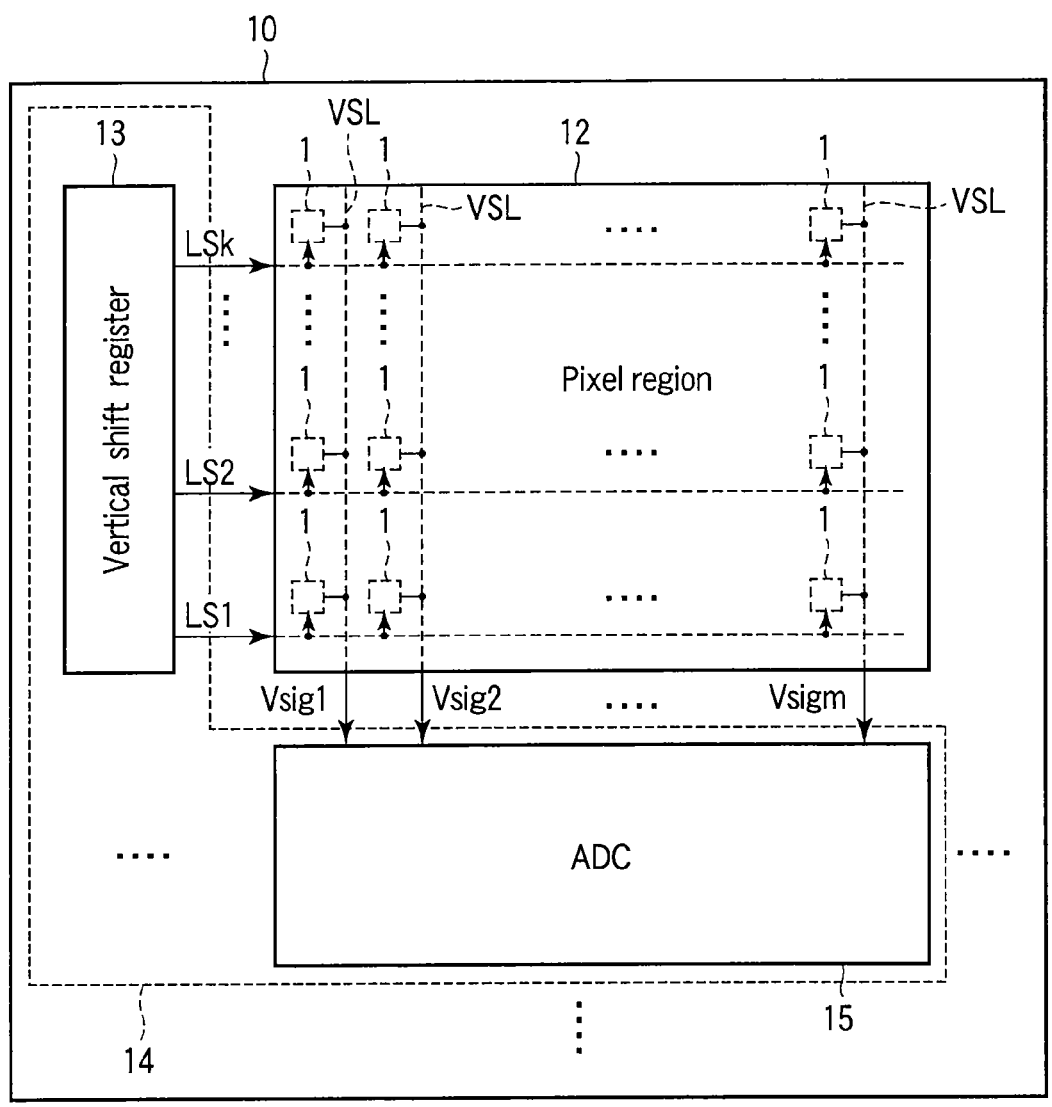
F I G. 1

Color filter 406

Plan-view structure example (1) (first embodiment)

Plan-view structure example (2) (first embodiment)
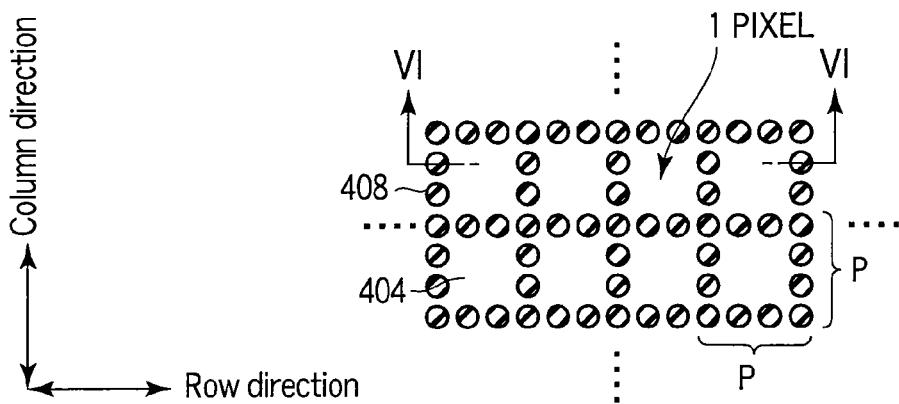
F I G. 5
Cross-sectional structure
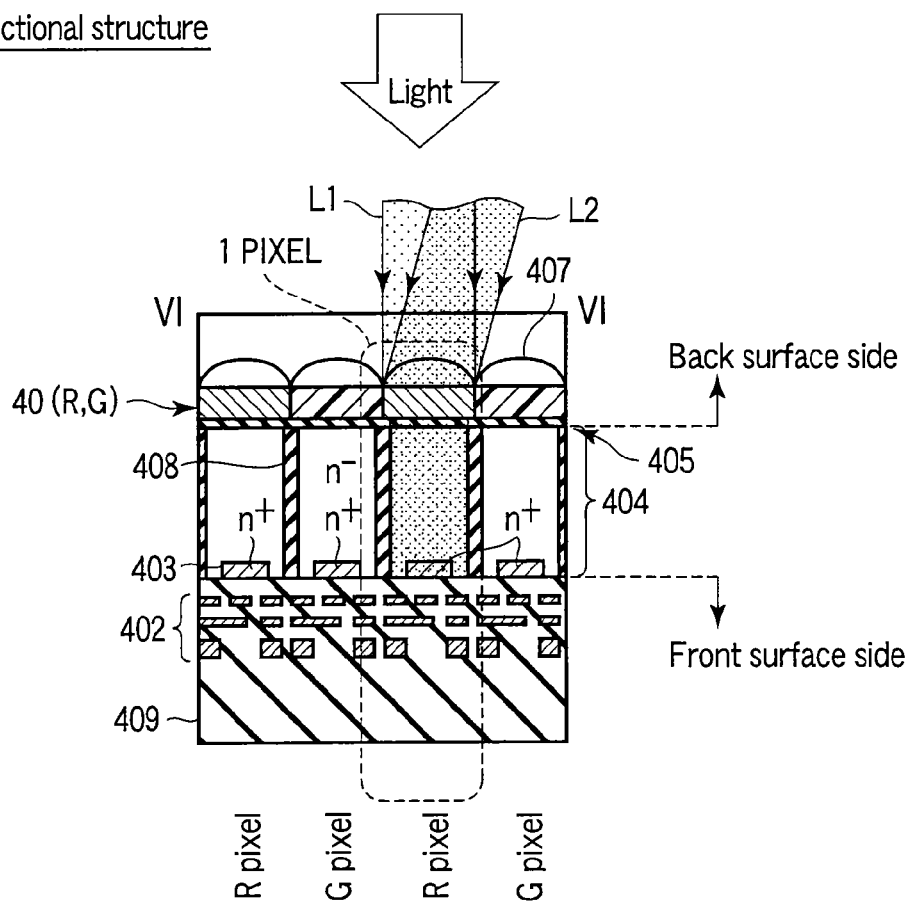
F I G. 6

Structure example of unit pixel
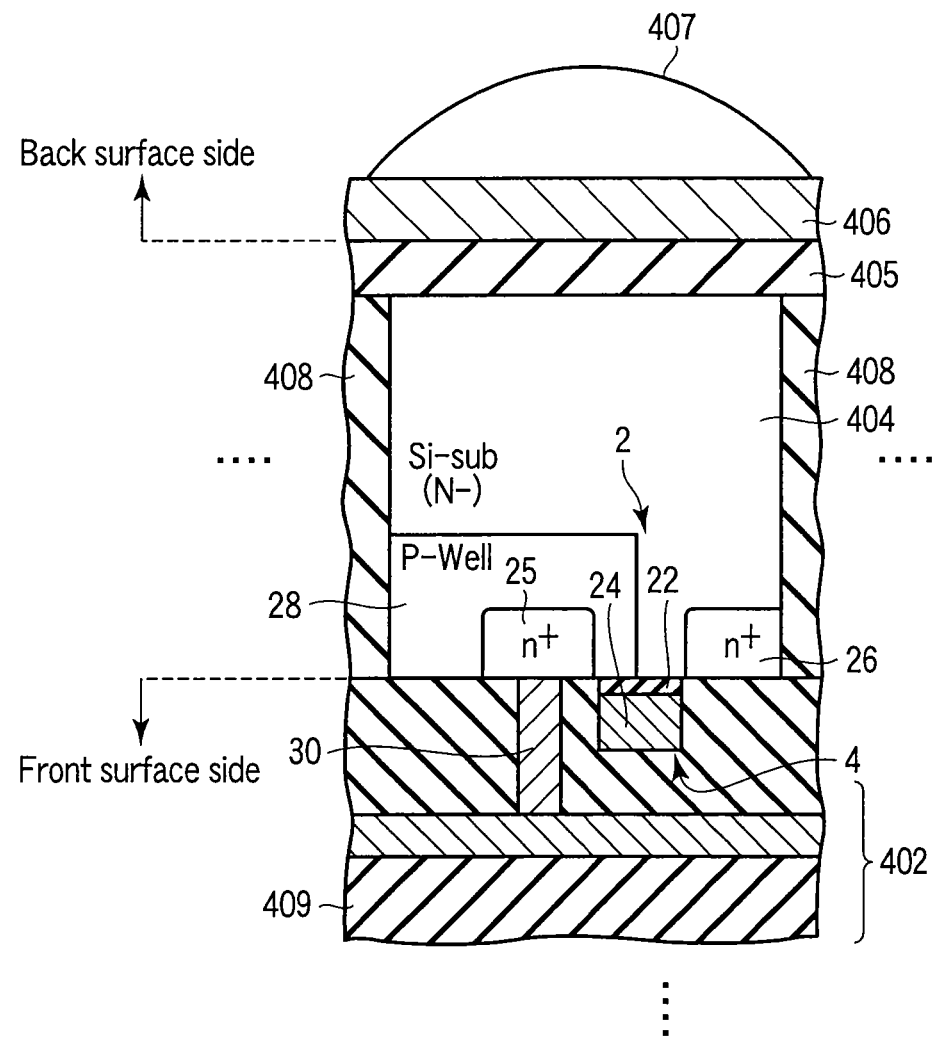
F I G. 7

Manufacturing method (first embodiment)
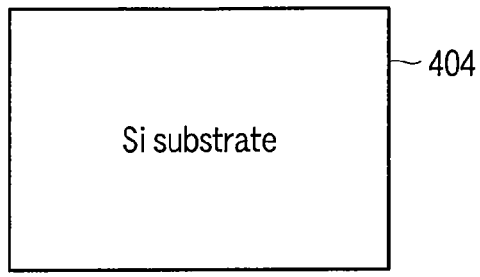
F I G. 8
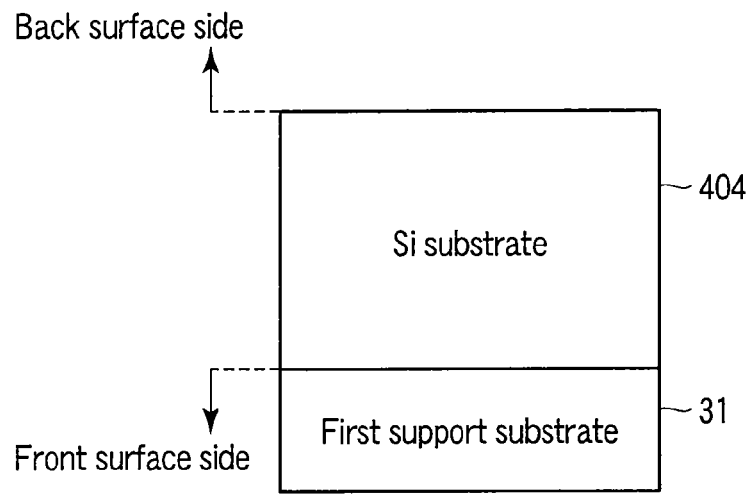
F I G. 9
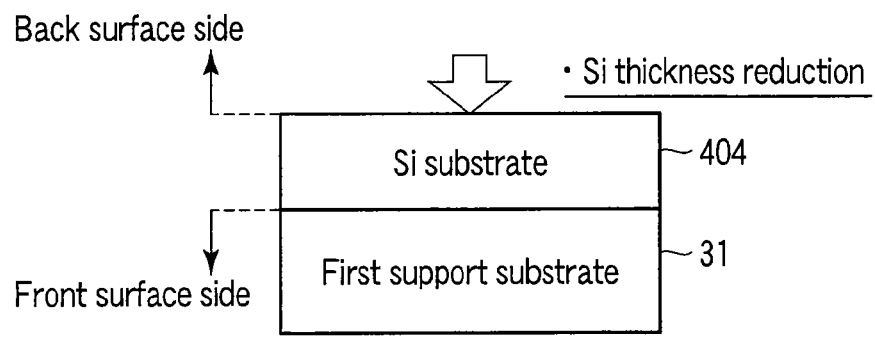
F I G. 10

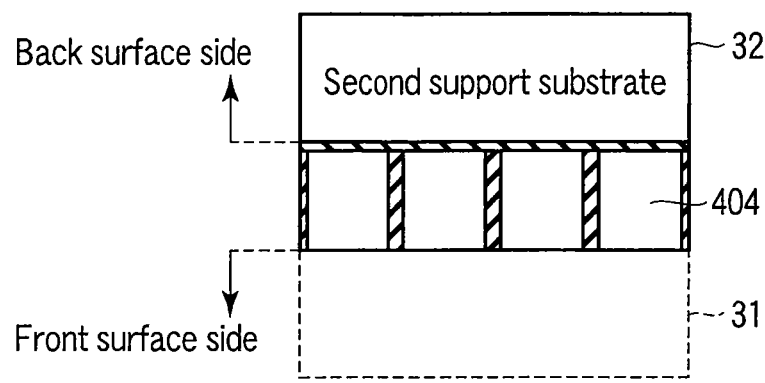
F I G. 1 4
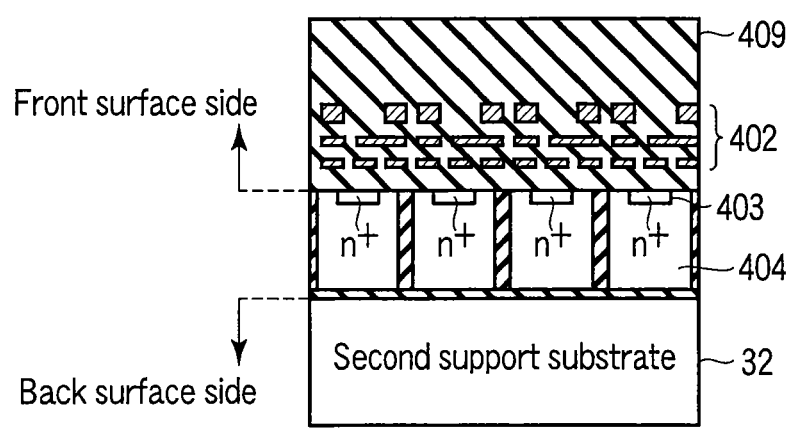
F I G. 1 5

Plan-view structure (1) (second embodiment)

Plan-view structure (2) (second embodiment)

Cross-sectional structure (second embodiment)
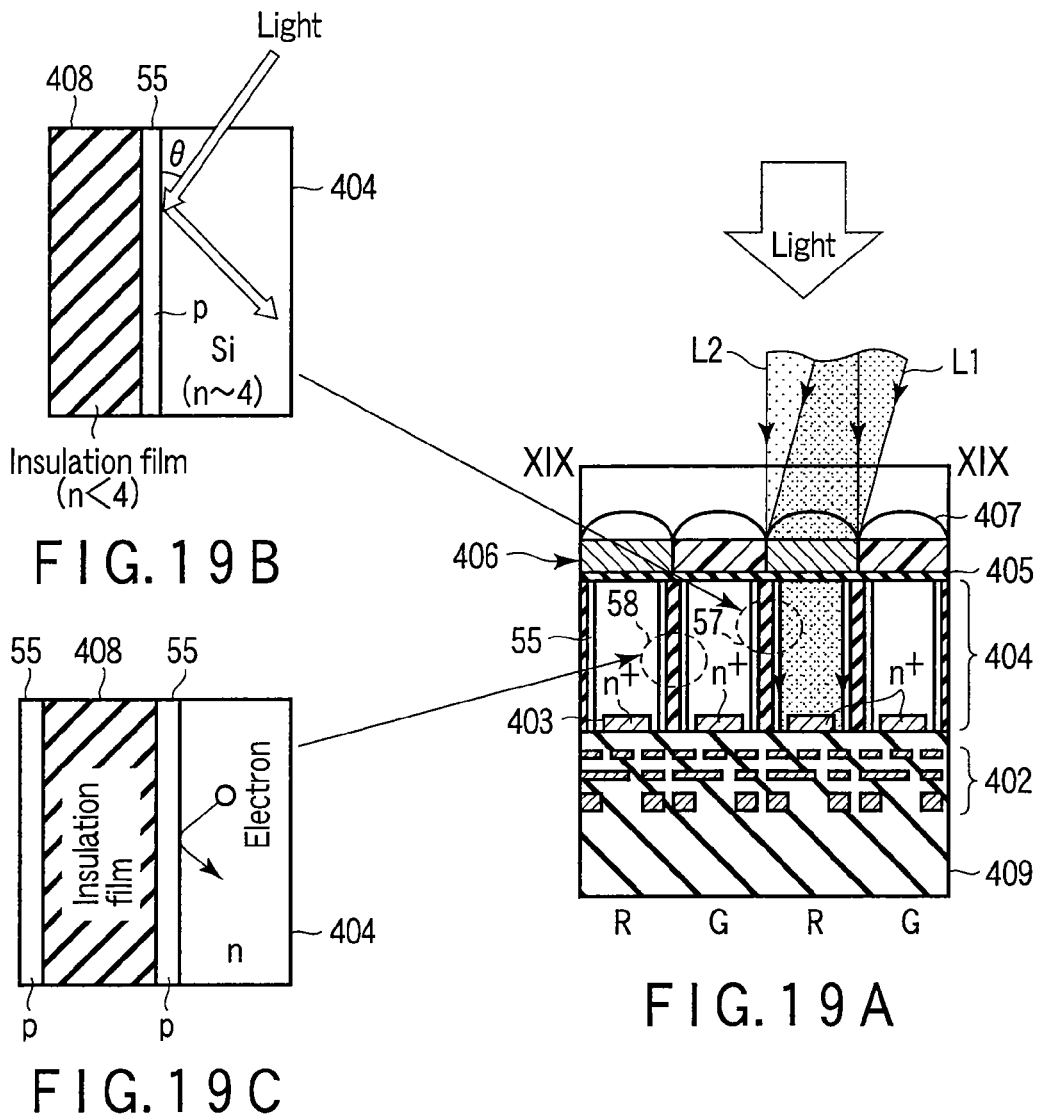
FIG. 19B
FIG. 19C
FIG. 19A
Manufacturing method (second embodiment)
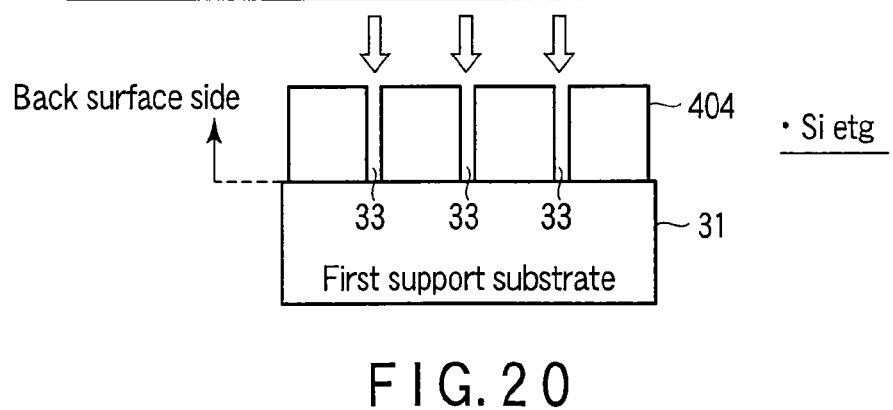
FIG. 20

Cross-sectional structure (2) (third embodiment)

(d2: distance of offset from Si substrate surface on front side)

Manufacturing method (third embodiment)
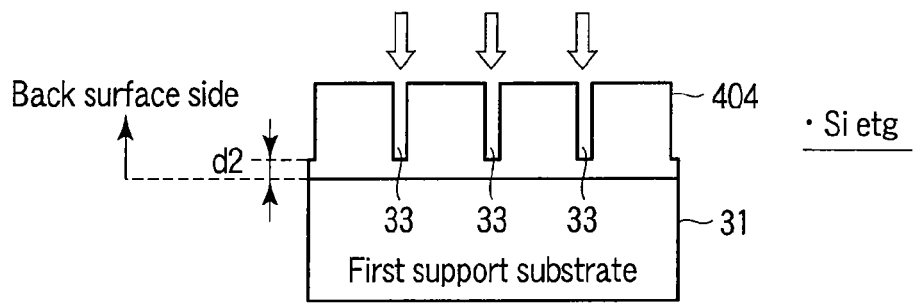
F I G. 2 9
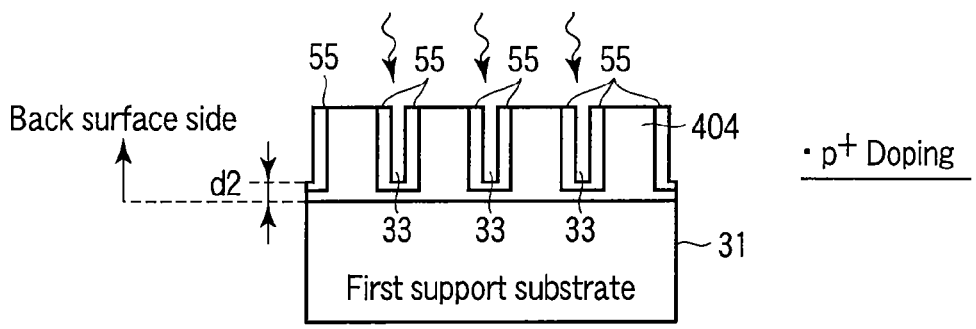
F I G. 3 0
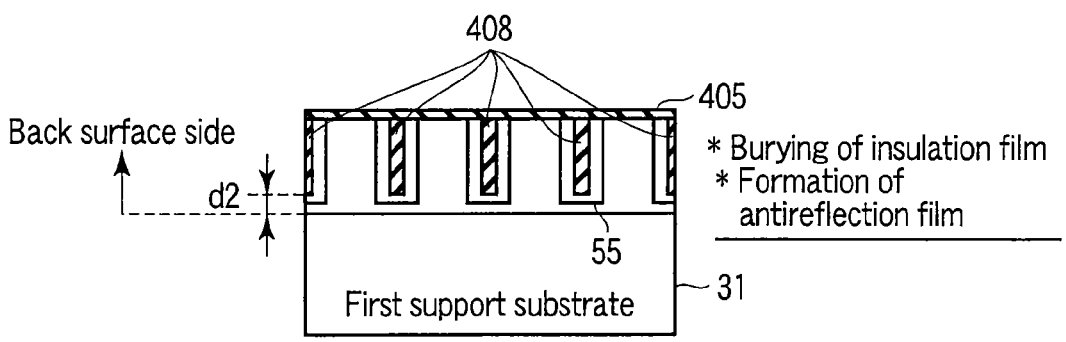
F I G. 3 1

SOLID-STATE IMAGING DEVICE AND MANUFACTURING METHOD THEREOF

CROSS-REFERENCE TO RELATED APPLICATIONS

This application is a continuation of and claims the benefit of priority under 35 U.S.C. §120 from U.S. Ser. No. 12/869,799 filed Aug. 27, 2010. U.S. Ser. No. 12/869,799 is a continuation application of PCT Application No. PCT/JP2009/053614 filed Feb. 20, 2009, which was published under PCT Article 21(2) in English.

This application is based upon and claims the benefit of priority under 35 U.S.C. §119 from Japanese Patent Application No. 2008-048412 filed Feb. 28, 2008, the entire contents of which are incorporated herein by reference.

FIELD

Embodiments described herein relate generally to a solid-state imaging device and a manufacturing method thereof, and is applied, for example, to a MOS solid-state imaging device.

BACKGROUND

At present, solid-state imaging devices including CMOS sensor are applied to various uses, such as digital still cameras, video movie cameras and monitor cameras. In particular, dominant devices are single-chip imaging devices which acquire plural color information by a single pixel array.

With a demand for an increase in the number of pixels and a decrease in optical size in recent years, there is a tendency that the pixel size is reduced more and more. For example, the pixel size of a CMOS sensor which has widely been used in recent years in digital cameras or the like is about 1.75 μm to about 2.8 μm. There is the following tendency with such fine pixels.

First, if the area of a unit pixel is decreased, the number of photons that can be received by the unit pixel decreases in proportion to the unit pixel area. As a result, the S (signal)/N (noise) ratio, relative to photon shot noise, decreases. If the S/N ratio cannot be maintained, the image quality on a reproduced screen deteriorates, and the quality of a reproduced image tends to lower.

Secondly, if the area of the unit pixel is reduced, crosstalk increases between neighboring pixels. As a result, although each pixel should normally have sensitivity only with respect to its unique wavelength region, the pixel has sensitivity with respect to a wavelength region at which the pixel should not normally have sensitivity. Consequently, color mixing occurs, and there is a tendency that the color reproducibility on the reproduced screen considerably deteriorates.

Thus, it is necessary to prevent a decrease in the S/N ratio by minimizing the decrease in sensitivity, thereby to maintain the S/N ratio even if the pixel is reduced in size, and it is necessary to prevent as much as possible the occurrence of color mixing, thereby to prevent degradation in color reproducibility even if the pixel is reduced in size.

As a structure for coping with the above-described tendency, there is known, for instance, a back-surface illumination type solid-state imaging device (see, e.g. Jpn. Pat. Appln. KOKAI Publication No. 2006-128392).

In the back-surface illumination type solid-state imaging device, incident light is radiated on a silicon (Si) surface (back surface) which is opposite to the silicon (Si) surface (front surface) on which a signal scanning circuit and its wiring layer are formed. In this back-surface illumination type structure in which light is incident on the silicon (Si) surface which is opposite to the silicon (Si) surface on which the signal scanning circuit and its wiring layer are formed, the light, which is incident on the pixel, can reach a light-receiving region, which is formed within the silicon (Si) substrate, without being blocked by the wiring layer. Thus, even with the fine pixel, a high quantum efficiency can be realized. As a result, with respect to the above-described first problem, that is, even in the case where the reduction in size of the pixel is progressed, there is a merit in suppressing the degradation in quality of the reproduced image.

In the conventional back-surface illumination type solid-state imaging device, however, no effective solution can be given to the above-described second problem. Specifically, in the back-surface illumination type solid-state imaging device, while incident light enters the silicon (Si) substrate that is the light-receiving region without being blocked by the signal scanning circuit and its wiring layer, there is a tendency that the incident light, which is not blocked by the wiring layer, leaks to a neighboring pixel, leading to color mixing.

For example, if the pixel is made finer, the aperture pitch of the micro-lens and color filter decreases, and diffraction occurs at a time point when the incident light falling on an R pixel with a particularly long wavelength has passed through the color filter. In this case, the light, which is obliquely incident on the light-receiving region in the silicon (Si) substrate, travels in a direction toward a neighboring pixel. If the light enters the neighboring pixel beyond an inter-pixel boundary, the light causes photoelectrons in the neighboring pixel, leading to crosstalk and color mixing. In addition, the light leaking into the light-receiving regions of the neighboring G pixel and B pixel causes color mixing. Hence, color reproducibility on the reproduced screen deteriorates, and the image quality decreases.

BRIEF DESCRIPTION OF THE DRAWINGS

FIG. 1 is a block diagram showing an example of the entire structure of a solid-state imaging device according to a first embodiment of the present invention;

FIG. 5 is a plan view showing a plan-view structure example (2) of the pixel array of the solid-state imaging device according to the first embodiment;

FIG. 6 is a cross-sectional view taken along line VI-VI in FIG. 4 and FIG. 5;

FIG. 7 is a cross-sectional view showing a unit pixel of the solid-state imaging device according to the first embodiment;

FIG. 8 is a cross-sectional view showing a fabrication step of the solid-state imaging device according to the first embodiment;

FIG. 9 is a cross-sectional view showing a fabrication step of the solid-state imaging device according to the first embodiment;

FIG. 10 is a cross-sectional view showing a fabrication step of the solid-state imaging device according to the first embodiment;

FIG. 14 is a cross-sectional view showing a fabrication step of the solid-state imaging device according to the first embodiment;

FIG. 15 is a cross-sectional view showing a fabrication step of the solid-state imaging device according to the first embodiment;

FIG. 19A is a cross-sectional view taken along line XIX-XIX in FIG. 17 and FIG. 18;

FIG. 19B is a cross-sectional view showing a part surrounded by a broken line 57 in FIG. 19A;

FIG. 19C is a cross-sectional view showing a part surrounded by a broken line 58 in FIG. 19A;

FIG. 20 is a cross-sectional view showing a fabrication step of the solid-state imaging device according to the second embodiment;

FIG. 29 is a cross-sectional view showing a fabrication step of the solid-state imaging device according to the third embodiment;

FIG. 30 is a cross-sectional view showing a fabrication step of the solid-state imaging device according to the third embodiment;

FIG. 31 is a cross-sectional view showing a fabrication step of the solid-state imaging device according to the third embodiment.

DETAILED DESCRIPTION

Figure 2:
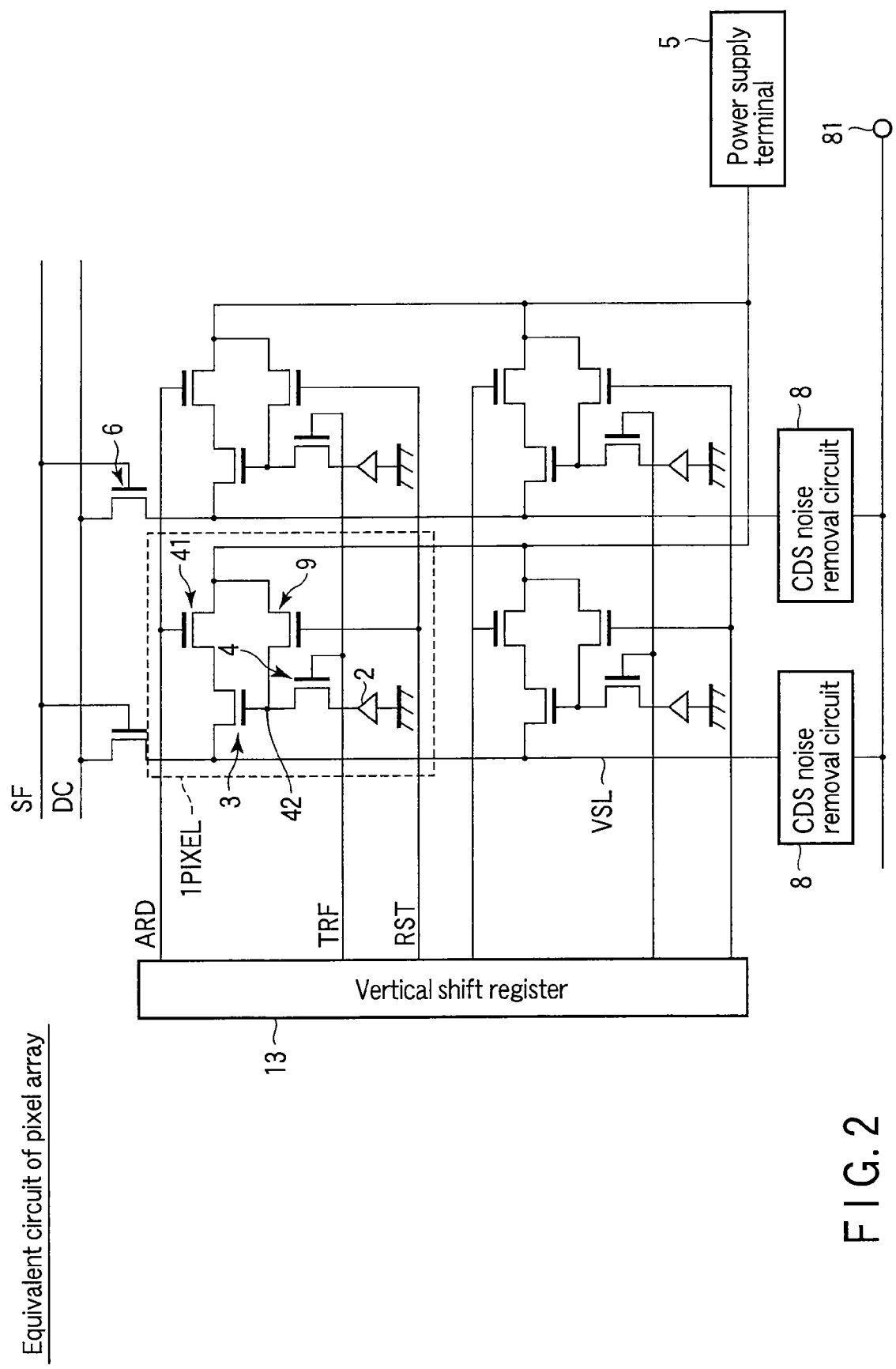
FIG. 2 is an equivalent circuit diagram of a pixel array of the solid-state imaging device according to the first embodiment.

In general, according to one embodiment, a solid-state imaging device comprising: a pixel region which is configured such that a photoelectric conversion unit and a signal scanning circuit unit are included in a semiconductor substrate, and a matrix of unit pixels is disposed; and a driving circuit region which is configured such that a device driving circuit for driving the signal scanning circuit unit is disposed on the semiconductor substrate, wherein the photoelectric conversion unit is provided on a back surface side of the semiconductor substrate, which is opposite to a front surface of the semiconductor substrate where the signal scanning circuit unit is formed, and the unit pixel includes an insulation film which is provided in a manner to surround a boundary part with the unit pixel that neighbors and defines a device isolation region.

Embodiments of the present invention will now be described with reference to the accompanying drawings. In the description below, common parts are denoted by like reference numerals throughout the drawings.

[First Embodiment]

<1. Structure Example>

To begin with, referring to FIG. 1 to FIG. 7, a description is given of a structure example of a solid-state imaging device according to a first embodiment. The example to be described below is a back-surface illumination type solid-state imaging device wherein a light-receiving surface is provided on the back side of a semiconductor substrate, which is opposite to a semiconductor substrate surface on which a signal scanning circuit unit is formed.

1-1. Entire Structure Example

Referring to FIG. 1, an entire structure example of the solid-state imaging device according to this embodiment is described. FIG. 1 is a system block diagram showing an example of the entire structure of the solid-state imaging device according to this embodiment. FIG. 1 shows an example in the case where an AD conversion circuit is disposed at a column position of a pixel array.

As shown in the Figure, a solid-state imaging device 10 according to this embodiment comprises a pixel region 12 and a driving circuit region 14.

The pixel region 12 is configured such that a photoelectric conversion unit and a signal scanning circuit unit are included in a semiconductor substrate, and a unit pixel matrix is disposed.

The photoelectric conversion unit includes a unit pixel 1, which includes a photodiode for effecting photoelectric conversion and accumulation, and functions as an imaging unit. The signal scanning circuit unit includes, e.g. an amplifying transistor 3 to be described later, reads out and amplifies a signal from the photoelectric conversion unit, and sends the amplified signal to an AD conversion circuit 15. In the case of the present embodiment, a light-receiving surface (photoelectric conversion unit) is provided on the back side of the semiconductor substrate, which is opposite to the semiconductor substrate surface on which the signal scanning circuit unit is formed.

The driving circuit region 14 is configured such that device driving circuits, such as a vertical shift register 13 for driving the signal scanning circuit unit and the AD conversion circuit, are disposed.

This description is directed to a part of the entire structure of a CMOS sensor, but the structure is not limited to this example. For example, use may be made of a structure wherein an ADC circuit is not disposed in parallel with the column but an ADC circuit is disposed on a chip level, or a structure wherein an ADC is not disposed on a sensor chip.

The vertical shift register 13 outputs signals LS1 to SLk to the pixel array 12, and functions as a select unit for selecting the unit pixels 1 on a row-by-row basis. Analog signals Vsig, which correspond to the amount of incident light, are output via vertical signal lines VSL from the unit pixels 1 of the selected row.

The AD conversion circuit (ADC) 15 converts the analog signals Vsig, which are input via the vertical signal lines VSL, to digital signals.

1-2. Structure Example of Pixel Array (Pixel Region)

Next, referring to FIG. 2, a description is given of a structure example of the pixel array (pixel region) 12 in FIG. 1. FIG. 2 is an equivalent circuit diagram showing the structure example of the pixel array according to the present embodiment. This example to be described below is a single-chip imaging device which acquires plural color information by the single pixel array 12.

As shown in the Figure, the pixel array 12 includes a plurality of unit pixels 1 which are disposed in a matrix at intersections between read-out signal lines from the vertical shift register 13 and the vertical signal lines VSL.

The unit pixel (PIXEL) 1 includes a photodiode 2, an amplifying transistor 3, a read-out transistor 4, a reset transistor 9, and an address transistor 41.

In the above, the photodiode 2 constitutes the photoelectric conversion unit. The amplifying transistor 3, read-out transistor 4, reset transistor 9 and address transistor 41 constitute the signal scanning circuit unit.

The cathode of the photodiode 2 is grounded.

The amplifying transistor 3 is configured to amplify and output the signal from a floating diffusion layer 42. The amplifying transistor 3 has a gate connected to the floating diffusion layer 42, a source connected to the vertical signal line VSL, and a drain connected to the source of the address transistor 41. Noise in an output signal of the unit pixel 1, which is sent from the vertical signal line VSL, is removed by a CDS noise removal circuit 8, and the noise-free signal is output from an output terminal 81.

The read-out transistor 4 is configured to control accumulation of signal charge in the photodiode 2. The read-out transistor 4 has a gate connected to a read-out signal line TRF, a source connected to the anode of the photodiode 2, and a drain connected to the floating diffusion layer 42.

The reset transistor 9 is configured to reset the gate potential of the amplifier transistor 3. The reset transistor 9 has a gate connected to a reset signal line RST, a source connected to the floating diffusion layer 42, and a drain connected to a power supply terminal 5 which is connected to a drain power supply.

The gate of the address transistor (transfer gate) 41 is connected to an address signal line ADR. A load transistor 6 has a gate connected to a select signal line SF, a drain connected to the source of the amplifier transistor 3, and a source connected to a control signal line DC.

[Read-out Driving Operation]

The read-out driving operation by this pixel array structure is as follows. To start with, the row select transistor 41 of the read-out row is set in an ON state by a row select pulse which is sent from the vertical shift register 13.

Subsequently, the reset transistor 9 is similarly set in an ON state by a reset pulse which is sent from the vertical shift register 13, and is reset at a voltage close to the potential of the floating diffusion layer 42. Then, the reset transistor 9 is set in an OFF state.

Then, the transfer gate 4 is set in an ON state, a signal charge that is accumulated in the photodiode 2 is read out to the floating diffusion layer 41, and the potential of the floating diffusion layer 42 is modulated in accordance with the read-out signal charge number.

Thereafter, the modulated signal is read out to the vertical signal VSL by the MOS transistor that constitutes a source follower, and the read-out operation is completed.

1-3. Plan-view Structure Example of Color Filter

Figure 3:
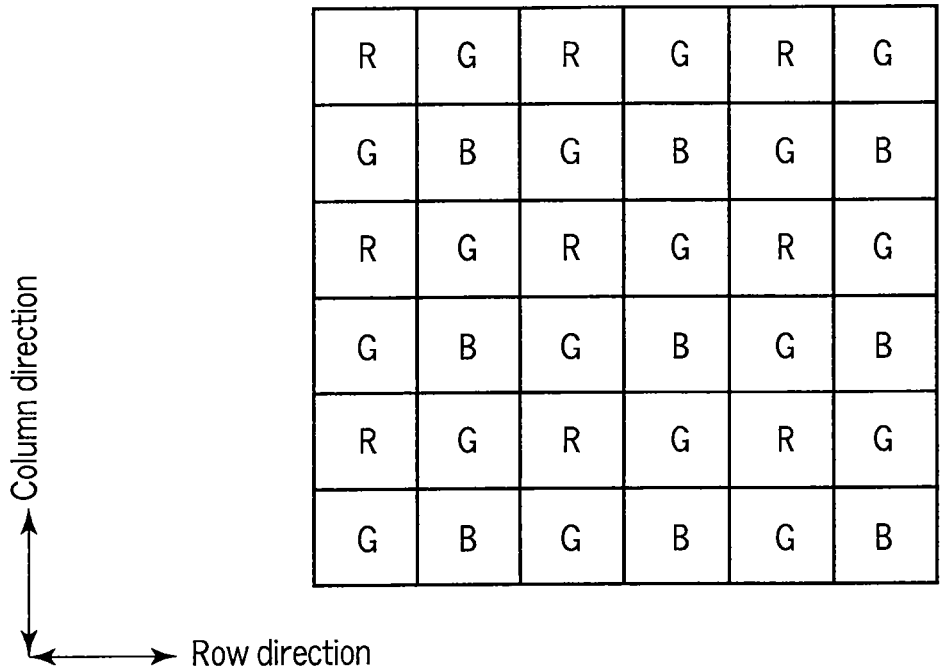
FIG. 3 is a plan view showing a color filter of the solid-state imaging device according to the first embodiment.

Next, referring to FIG. 3, a description is given of a plan-view structure example of a color filter 406 which is included in the solid-state imaging device according to the present embodiment. FIG. 3 is a layout view showing how the color filter is disposed in order to acquire a color signal in the single-chip solid-state imaging device structure.

In the Figure, a pixel that is indicated by R is a pixel in which a color filter, which principally passes light of a red wavelength region, is disposed. A pixel that is indicated by G is a pixel in which a color filter, which principally passes light of a green wavelength region, is disposed. A pixel that is indicated by B is a pixel in which a color filter, which principally passes light of a blue wavelength region, is disposed.

In the present embodiment, a color filter arrangement, which is most frequently used as Bayer arrangement, is shown. As shown in the Figure, neighboring color filters (R, G, B) are arranged such that mutually different color signals are obtained in the row direction and column direction.

1-4. Plan-view Structure Example

Figure 4:
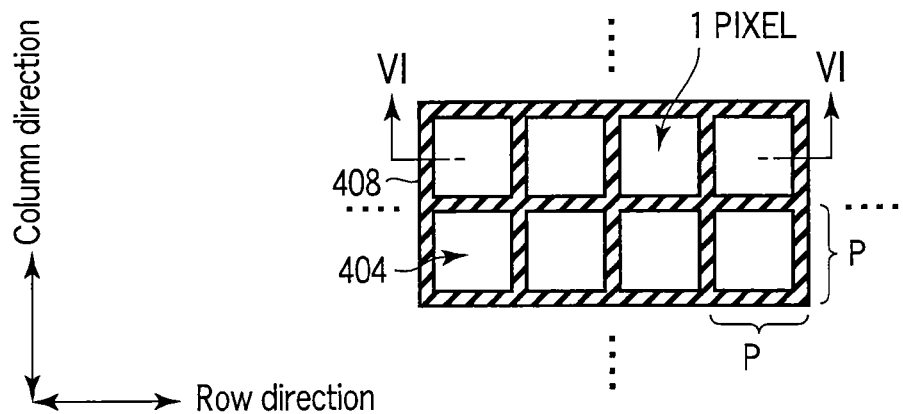
FIG. 4 is a plan view showing a plan-view structure example (1) of the pixel array of the solid-state imaging device according to the first embodiment.

Next, referring to FIG. 4 and FIG. 5, a description is given of a plan-view structure example of the pixel array 12 which is included in the solid-state imaging device of the present embodiment. The example to be described below is a back-surface illumination type solid-state imaging device wherein a light-receiving surface is formed on a substrate surface (back surface) which is opposite to a semiconductor substrate surface (front surface) on which the circuit of the signal scanning circuit unit 15, which is composed of the amplifying transistor 3, etc., is formed.

[Plan-view Structure Example (1)]

As shown in FIG. 4, unit pixels 1 are disposed in a matrix in the row direction and the column direction on the back surface of a silicon (Si) substrate 404.

In addition, a device isolation insulation film (insulation film) 408, which defines device isolation regions in a manner to surround boundary parts between neighboring unit pixels 1, is provided on the back surface of the silicon (Si) substrate 404. Thus, the device isolation insulation film 408 is disposed in a lattice shape in a manner to surround the unit pixels 1 in the row direction and column direction.

The device isolation insulation film 408 is formed of an insulation film having a refractive index which is lower than the refractive index of silicon (Si). For example, the device isolation insulation film 408 should preferably be formed of an insulative material having a refractive index of about 3.9 or less with respect to incident light with wavelengths of about 400 nm to 700 nm. To be more specific, the device isolation insulation film 408 is formed of, e.g. an insulative material such as silicon oxide film ($SiO_2$ film), silicon nitride film ($Si_3N_4$) or titanium oxide (TiO).

In addition, as shown in the Figure, the pixel pitch P of the unit pixels 1 in this example is common in the row direction and column direction.

[Plan-view Structure Example (2)]

A plan-view structure shown in FIG. 5 differs from the plan-view structure (1) shown in FIG. 4 in that a device isolation insulation film 408 is formed in a hole-like plan-view shape and disposed discontinuously in a manner to surround boundary parts between neighboring unit pixels 1 on the back surface of the silicon substrate 404. Similarly, the device isolation insulation film 408 is disposed in a lattice shape in a manner to surround the unit pixels 1 in the row direction and column direction.

In the present embodiment, the plan-view structure with the arrangement of discontinuous hole-like portions of the device isolation insulation film 408 is shown, but it may be possible that some portions of the device isolation insulation film 408 are formed continuous. The effect of forming the device isolation insulation film 408 in the hole is the same as the effect of filling an air in the hole.

1-5. Cross-sectional Structure Example

Next, referring to FIG. 6 and FIG. 7, a description is given of a cross-sectional structure example of the pixel array 12 which is included in the solid-state imaging device according to the embodiment. The description is given by taking, as an example, a cross section along line VI-VI in FIG. 4 and FIG. 5.

As shown in FIG. 6, on the front surface of the silicon substrate 404, the unit pixel 1 includes a wiring layer 402 which is provided in an interlayer insulation film 409 and constitutes the circuit of the signal scanning circuit unit 15 that is composed of the amplifying transistor 3, etc.

On the other hand, on the back surface of the silicon substrate 404, the unit pixel 1 includes an n-type diffusion layer 403 which accumulates signal electrons, an antireflection film 405, a color filter 406, a micro-lens 407 and device isolation insulation film 408. As described above, the device isolation insulation film 408 is provided at a boundary part between the pixels in the Si substrate 404. The device isolation insulation film 408, as described above, is formed of an insulation film having a refractive index which is lower than the refractive index of the silicon substrate 404. As will be described later, the n+ diffusion layer 403 is a diffusion layer which constitutes a photodiode that forms a signal charge accumulation region.

Next, referring to FIG. 7, the cross-sectional structure example of the unit pixel 1 in the vicinity of the surface side of the semiconductor substrate 404 is described in greater detail.

In the illustrated cross section, the unit pixel 1 includes a reset transistor 4 which is provided on the surface of the silicon substrate 404, and a photodiode 2 which is provided in the silicon substrate 404. In the present embodiment, exemplification has been made of the case in which the silicon substrate is the n-type diffusion layer. However, the silicon substrate may be a p-type diffusion layer.

The read-out transistor 4 is composed of a gate insulation film 22 which is provided in the interlayer insulation film 409 on the substrate 404, a gate electrode 24 which is provided in the interlayer insulation film 409 on the gate insulation film 22, and a source 26 (n+ diffusion layer 403) and a drain 25 (n+ diffusion layer 403) which are provided, spaced apart, in the silicon substrate 404 in a manner to sandwich the gate electrode 24.

The photodiode 2 is composed of an n+ diffusion layer that is the source 26, and a P-well layer 28 that is formed in the silicon substrate 404 in contact with the source 26 and forms a PN junction with the source 26.

The drain 25 is electrically connected to the wiring layer 402 via a contact wiring layer 30 which is provided in the interlayer insulation film 409 on the drain 25. In accordance with an electric signal that is output from the wiring layer 402, the pixel of the unit pixel 1 is displayed. The other unit pixels have the same structure, so a detailed description thereof is omitted.

<2. Optical Function/Effect>

Next, referring to FIG. 6, the optical function/effect of the solid-state imaging device according to the embodiment is described. As has been described in the above sections 1-4 and 1-5, in the solid-state imaging device of this embodiment, the device isolation insulation film (insulation film) 408, which defines device isolation regions in a manner to surround boundary parts between neighboring unit pixels 1, is provided on the back surface of the silicon (Si) substrate 404. With this structure, the following optical function/effect is obtained.

Specifically, in a structure according to a comparative example to be described later, the device isolation insulation film (insulation film) 408 as in the present embodiment is not provided. Consequently, the light, which is obliquely incident on the light-receiving region in the silicon (Si), travels in a direction toward a neighboring pixel, and the light enters the neighboring pixel beyond an inter-pixel boundary. As a result, the light causes photoelectrons in the neighboring pixel, leading to crosstalk and color mixing. Hence, color reproducibility on the reproduced screen deteriorates.

On the other hand, as shown in FIG. 6, according to the structure of the present embodiment, since light L2, which is obliquely incident, is reflected by the device isolation insulation film 408, it is possible to prevent the light from entering the neighboring unit pixel. Accordingly, neither crosstalk nor color mixing occurs.

In particular, if the pixel is made finer, the aperture pitch of the micro-lens and color filter decreases, and diffraction occurs at a time point when the incident light falling on an R pixel with a particularly long wavelength has passed through the color filter. In this case, the light, which is obliquely incident on the light-receiving region in the silicon (Si) substrate 404, travels in a direction toward a neighboring pixel. If the light enters the neighboring pixel beyond an inter-pixel boundary, the light causes photoelectrons in the neighboring pixel, leading to crosstalk and color mixing. In addition, the light leaking into the light-receiving regions of the neighboring G pixel and B pixel causes color mixing. Hence, color reproducibility on the reproduced screen deteriorates, and the image quality decreases. Therefore, the present embodiment is effective in that even when light is incident on the R pixel of the R, G and B pixels, which has a particularly long wavelength, crosstalk can be prevented and the occurrence of color mixing can be prevented, and the color reproducibility on the reproduced image can be improved.

How much the incident light is reflected by the device isolation region is determined by the relationship between the refractive index of the silicon (Si) and the refractive index of the device isolation insulation film 408 that is formed in the device isolation region. When $\theta in$ is the angle between the direction of light traveling through the Si and the surface of the device isolation insulation film 408, $nsi$ is the refractive index of the Si, and $nin$ is the refractive index of the insulation film 408, $\theta in$ is expressed by the following equation (1):

$$\theta in = \text{ARCTAN}(nin/nsi) \quad (1)$$

As indicated by the above equation (1), it is understood that as the refractive index $nin$ of the device isolation insulation film 408 is lower than the refractive index $nsi$ of the Si, the degree of reflection of light becomes greater, and the amount of crosstalk becomes smaller accordingly. If the device isolation insulation film 408 has such a plan-view shape that the device isolation insulation film 408 is continuously formed in a lattice shape along pixel boundaries without spacing, as shown in FIG. 4 in connection with the above section 1-4, light is reflected at the device isolation insulation film 408 with no leak.

The plan-view shape of the device isolation insulation film 408 is not limited to this example, and the device isolation insulation film 408 may be formed in a hole-like shape at predetermined or less intervals in a manner to surround the unit pixels, as shown in FIG. 5. The reason for this is that if the interval of the device isolation insulation film 408 is a predetermined distance or less in relation to the wavelength of incident light, the incident light does not travel to the neighboring pixels even if there is spacing between the device isolation insulation films 408. When the wavelength of incident light is λ, the interval d is generally expressed by the following equation (2):

$$d = \tfrac{1}{2} * \lambda \quad (2)$$

In the structure shown in FIG. 6, the wavelength range of incident light is the visible light range. In particular, light that is incident on the G pixel and R pixel travels deep into the silicon (Si) substrate 404, thus possibly becoming a factor of crosstalk. It is thus understood that according to the equation (2), if the spacing of the device isolation insulation film 408 at the inter-pixel boundary is about 270 nm or less, relative to the peak wavelength of 540 nm of the G pixel, the energy of light traveling to the neighboring unit pixel 1 through the spacing is sufficiently small even if there is spacing d, and no crosstalk occurs.

<3. Manufacturing Method>

Next, referring to FIG. 8 to FIG. 16, a description is given of the method of manufacturing the solid-state imaging device according to the first embodiment. In the description below, exemplification is made of the structure shown in FIG. 6.

(Step 1)

FIG. 8 shows a silicon (Si) substrate 404 prior to processing.

(Step 2)

As shown in FIG. 9, a first support substrate 31, which is formed of, e.g. silicon (Si), is attached to the surface of the substrate 404 on the side (front side) on which a signal scanning circuit, etc. are formed on the silicon (Si) substrate 404.

(Step 3)

Then, as shown in FIG. 10, etching, such as RIE (Reactive Ion Etching), is performed on the surface of the silicon substrate 404 on the side (back side), which is opposite to the side of the semiconductor substrate on which the signal scanning circuit, etc. are formed, and which becomes the light-receiving region. In the case of this example, in this step, the thickness of the silicon substrate 404 is reduced to, e.g. about 3 to 7 μm.

(Step 4 (Si etg))

Figure 11:
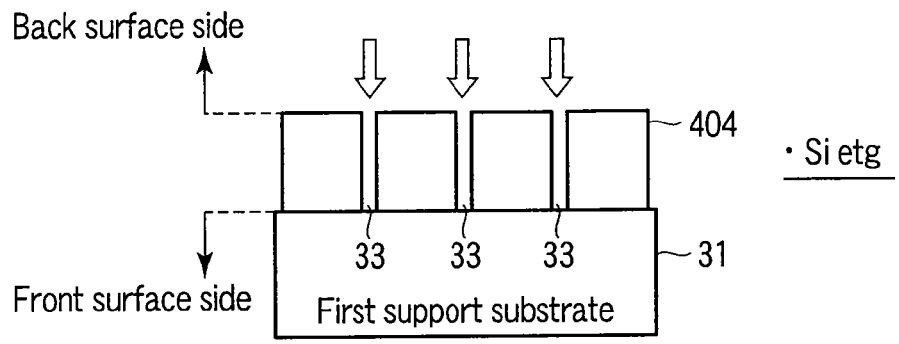
FIG. 11 is a cross-sectional view showing a fabrication step of the solid-state imaging device according to the first embodiment.

Subsequently, as shown in FIG. 11, selective etching is performed by, e.g. photolithography, on the surface (back side) of the silicon substrate 404, on which the light-receiving region is formed and which becomes the device isolation boundary of the unit pixel, to the surface of the first support substrate 31, and trenches 33 are formed.

In this step, for example, by altering a mask pattern for anisotropic etching such as RIE or photolithography, the hole-like openings as shown in FIG. 5 can be formed.

(Step 5 (Burying of Insulation Film, Formation of Antireflection Film))

Figure 12:
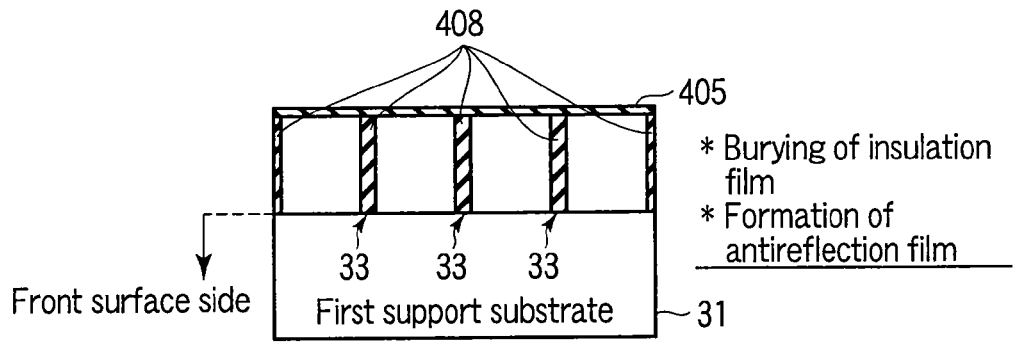
FIG. 12 is a cross-sectional view showing a fabrication step of the solid-state imaging device according to the first embodiment.

Subsequently, as shown in FIG. 12, an insulative material, such as a silicon oxide film ($SiO_2$ film) or a titanium oxide (TiO) film, which has a lower refractive index than silicon (Si), is buried in the trenches 33 (or hole-like openings) formed in the above step 4, by, e.g. CVD (Chemical Vapor Deposition) or spin coating. Thereby, a device isolation insulation film 408 is formed. For example, the device isolation insulation film 408 should preferably be formed of an insulative material having a refractive index of about 3.9 or less with respect to incident light with wavelengths of about 400 nm to 700 nm.

Then, an insulative material is deposited on the device isolation insulation film 408 by, e.g. CVD. Thus, an antireflection film 405 is formed over the entire bottom surface of the substrate.

(Step 6)

Figure 13:
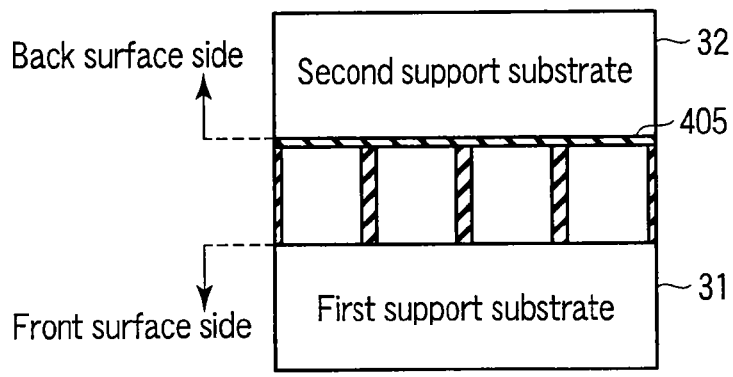
FIG. 13 is a cross-sectional view showing a fabrication step of the solid-state imaging device according to the first embodiment.

Subsequently, as shown in FIG. 13, a second support substrate 32, which is formed of, e.g. silicon (Si), is attached onto the antireflection film 405 on the back surface side of the silicon substrate 404, which becomes the light-receiving side.

(Step 7)

Subsequently, as shown in FIG. 14, the first support substrate on the signal operation circuit side, which is attached to the front surface side of the silicon substrate 404 in the above step 2, is removed.

(Step 8)

Then, as shown in FIG. 15, the second support substrate 32 and silicon substrate 404 are turned upside down, and a p-type or n-type diffusion layer 403, etc. are formed on the surface of the silicon substrate 404 by, e.g. an ordinary LSI fabrication process, thereby forming active elements such as a photodiode 2 and a read-out transistor 4 (not shown).

Thereafter, a silicon oxide film, for instance, is deposited on the structure, which is formed on the front surface side of the silicon substrate 404, by means of, e.g. CVD, thus forming an interlayer insulation film 409. Then, a wiring layer 402 for connecting the above-described MOS-FET, etc. is formed in the interlayer insulation film 409, and the signal operation circuit is formed.

(Step 9)

Subsequently, a third support substrate (not shown) is further attached to the side (front surface side) on which the signal operation circuit has been formed in the above step 8.

Figure 16:
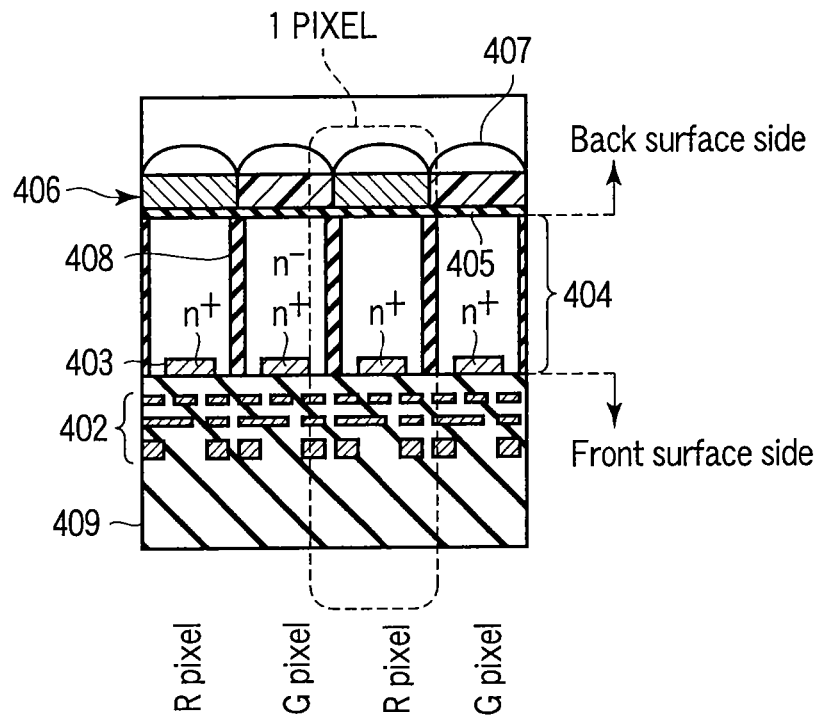
FIG. 16 is a cross-sectional view showing a fabrication step of the solid-state imaging device according to the first embodiment.

Then, as shown in FIG. 16, the second support substrate 32 on the opposite side (front surface side) is removed.

Finally, the third support substrate (not shown) and the silicon substrate 404 are turned upside down, and a color filter 406 and a micro-lens 407 are successively formed on the back surface of the silicon substrate 404.

Through the above-described fabrication steps, the solid-state imaging device shown in FIG. 6 is manufactured.

<4. Advantageous Effects>

According to the solid-state imaging device of the present embodiment and the manufacturing method thereof, at least the following advantageous effects (1) and (2) can be obtained.

(1) Since crosstalk between neighboring pixels can be prevented and occurrence of color mixing can be prevented, the color reproducibility on the reproduced screen can advantageously be improved.

As shown in FIG. 6, etc., in the structure of the solid-state imaging device of the present embodiment, the light-receiving surface includes the device isolation insulation film 408 which defines device isolation regions in a manner to surround boundary parts between neighboring unit pixels (PIXEL) 1. The device isolation insulation film 408 is formed of an insulative film having a lower refractive index than the silicon (Si). For example, the device isolation insulation film 408 should preferably be formed of an insulative material having a refractive index of about 3.9 or less with respect to incident light with wavelengths of about 400 nm to 700 nm. To be more specific, the device isolation insulation film 408 is formed of an insulative material such as a silicon oxide film ($SiO_2$ film) or a titanium oxide (TiO) film. In addition, as shown in FIG. 4, the device isolation insulation film 408 is disposed, for example, in a lattice shape in plan, in a manner to surround the unit pixels 1 in the row direction and column direction.

According to the above structure, as shown in FIG. 6, since obliquely incident light L2 is reflected by the device isolation film 408, it is possible to prevent the light from entering the neighboring unit pixel. Accordingly, neither crosstalk nor color mixing occurs, and the color reproducibility on the reproduced screen can advantageously be improved.

(2) Even in the case where the reduction in size of the pixel progresses, the degradation in quality of a reproduced image can advantageously be suppressed.

If the area of the unit pixel is decreased, the number of photons that can be received by the unit pixel decreases in proportion to the unit pixel area. As a result, the S/N ratio, relative to photon shot noise, decreases. If the S/N ratio cannot be maintained, the image quality on a reproduced screen deteriorates, and the quality of a reproduced image tends to lower (the above-described first problem).

The solid-state imaging device according to the present embodiment is of the back-surface illumination type. Thus, incident light can be radiated on the silicon (Si) surface (back surface) which is opposite to the silicon (Si) surface (front surface) on which the signal scanning circuit and the wiring layer thereof are formed. Thus, the light, which is incident on the pixel, can reach the light-receiving region, which is formed within the silicon (Si) substrate, without being blocked by the wiring layer, and a high quantum efficiency can be realized even with the fine pixel. As a result, with respect to the above-described first problem, that is, even in the case where the reduction in size of the pixel is progressed, the degradation in quality of the reproduced image can advantageously be suppressed.

By virtue of the above advantageous effects (1) and (2), the present embodiment is more effective when this embodiment is applied to the back-surface type solid-state imaging device.

[Second Embodiment (An Example in which a Diffusion Layer is Further Provided)]

Next, a solid-state imaging device according to a second embodiment and a manufacturing method thereof are described with reference to FIG. 17 to FIG. 22. This embodiment relates to an example further including a p-type diffusion layer 55 which is provided in the semiconductor substrate 404 along a side wall of the device isolation insulation film 48. A detailed description of the parts common to those in the first embodiment is omitted here.

<Plan-view Structure Example>

To begin with, a plan-view structure example of a pixel array 12 according to the present embodiment is described with reference to FIG. 17 and FIG. 18.

Figure 17:
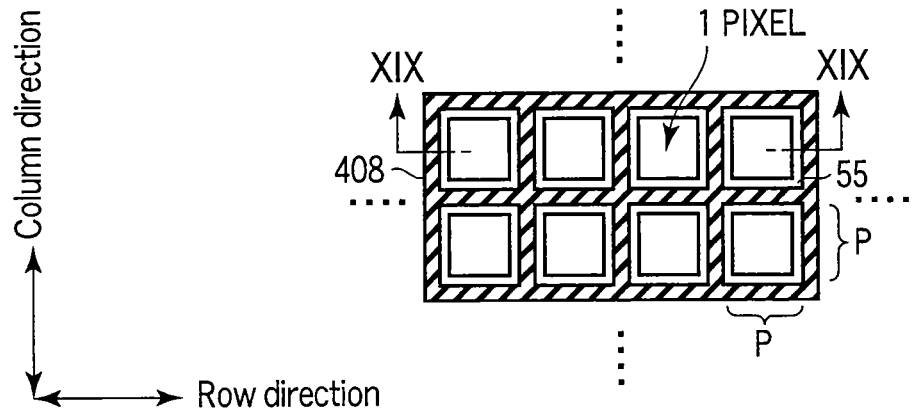
FIG. 17 is a plan view showing a plan-view structure example (1) of a pixel array of a solid-state imaging device according to a second embodiment.

A plan-view structure example (1) shown in FIG. 17 differs from the first embodiment in that a p-type diffusion layer 55, which is provided in a rectangular plan-view shape in a manner to surround the unit pixel 1, is further included in the semiconductor substrate 404 along a side wall of the device isolation insulation film 48.

Figure 18A:
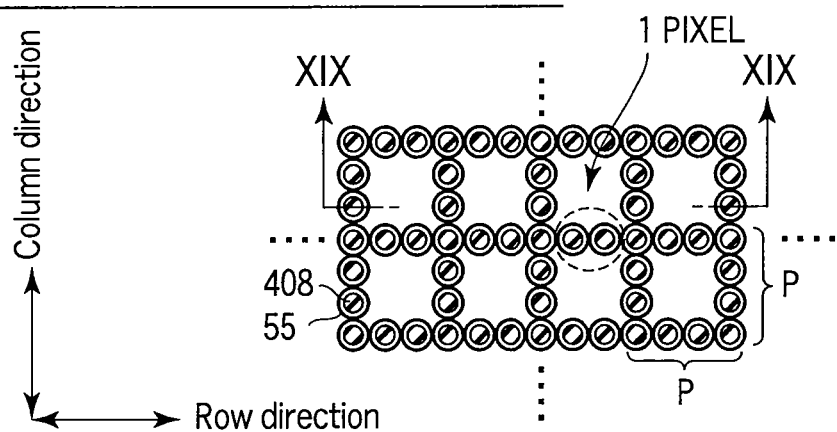
FIG. 18A is a plan view showing a plan-view structure example (2) of the pixel array of the solid-state imaging device according to the second embodiment.
Figure 18B:
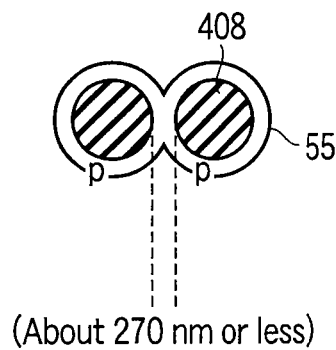
FIG. 18B is a plan view showing a part surrounded by a broken line in FIG. 18A.

A plan-view structure example (2) shown in FIG. 18A and FIG. 18B differs from the first embodiment in that a p-type diffusion layer 55, which is provided in a circular plan-view shape in a manner to surround the unit pixel 1, is further included in the semiconductor substrate 404 along a side wall of the device isolation insulation film 48. In the example of FIG. 18, the case in which the plan-view shape of the device isolation is circular is illustrated, but this plan-view shape may be rectangular.

In addition, as shown in FIG. 18B, the film thickness of the p-type diffusion layer neighboring in the row direction and column direction (i.e. the distance between the device isolation insulation films 408) should preferably be, e.g. about 270 nm or less. Preferably, the p-type diffusion layer 55 should be formed continuously, without being separated. The reason is that if the p-type diffusion layer 55 is formed without spacing between the neighboring unit pixels 1, the p-type diffusion layer 55 not only has the effect of preventing dark current, as described above, but also has the effect of preventing diffusion between the n-type diffusion layer 403 that becomes the light-receiving region and the n-type diffusion layer 403 in the neighboring unit pixel 1.

<Cross-Sectional Structure Example and Optical Function/Effect>

Next, referring to FIG. 19A to FIG. 19C, a cross-sectional structure example of the present embodiment and the optical function/effect thereof are described. Exemplification is made of a cross-sectional structure along line XIX-XIX in FIG. 17 and FIG. 18.

As shown in FIG. 19A, the structure of this example differs from the first embodiment in that the p-type diffusion layer 55 is provided in the semiconductor substrate 404 along the side wall of the device isolation insulation film 48.

With this structure, the following optical function/effect is obtained.

As shown in FIG. 19B, since light L2, which is obliquely incident, is reflected by the device isolation insulation film 408, it is possible to prevent the light from entering the neighboring unit pixel. Like the first embodiment, neither crosstalk nor color mixing occurs, and the color reproducibility on the reproduced screen can advantageously be improved.

In addition, as shown in FIG. 19C, since depletion at the interface between the silicon (Si) substrate 404 and the device isolation insulation film 408 can be prevented, dark current occurring due to, e.g. a crystal defect that is present at a boundary surface, can advantageously be reduced.

In this case, as shown in the Figure, it is preferable that the p-type diffusion layer 55 be formed continuously between the neighboring unit pixels 1. The reason for this is that if the p-type diffusion layer 55 is formed without spacing between the neighboring unit pixels 1, the p-type diffusion layer 55 not only has the effect of preventing dark current, as described above, but also has the effect of preventing diffusion between the n-type diffusion layer 403 that becomes the light-receiving region and the n-type diffusion layer 403 in the neighboring unit pixel 1.

<Manufacturing Method>

Figure 21:
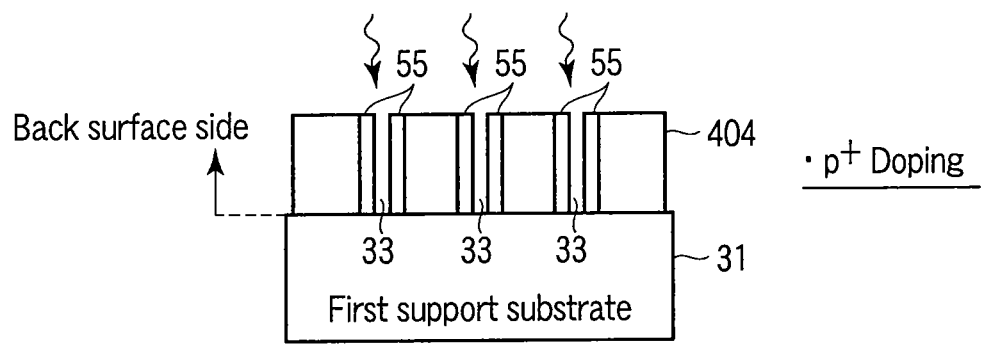
FIG. 21 is a cross-sectional view showing a fabrication step of the solid-state imaging device according to the second embodiment.
Figure 22:
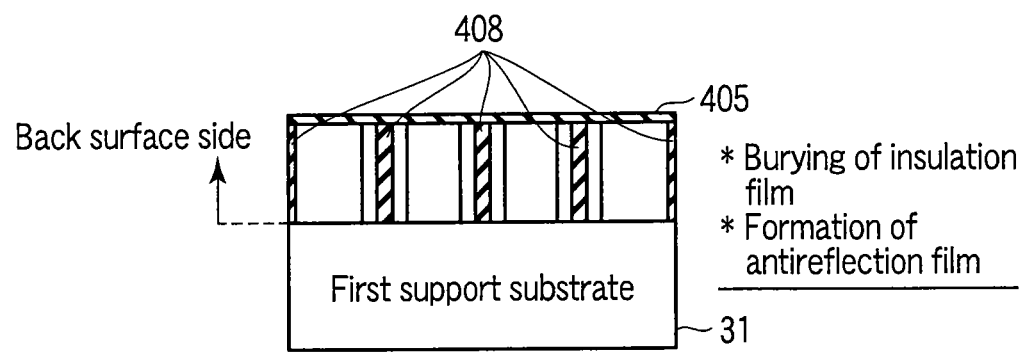
FIG. 22 is a cross-sectional view showing a fabrication step of the solid-state imaging device according to the second embodiment.

Next, referring to FIG. 20 to FIG. 22, a description is given of the method of manufacturing the solid-state imaging device according to the second embodiment. A detailed description of the parts common to those in the first embodiment is omitted here.

As shown in FIG. 20, selective etching is performed by, e.g. photolithography, on the back-surface side of the silicon substrate 404, on which the light-receiving region is formed and which becomes the device isolation boundary of the unit pixel, to the surface of the first support substrate 31, and trenches 33 are formed.

In this step, for example, by altering a mask pattern for anisotropic etching such as RIE or photolithography, the hole-like openings as shown in FIG. 18 can be formed.

Subsequently, as shown in FIG. 21, for example, by using a method such as solid-state diffusion, a p-type dopant such as boron (B) or indium (In) is doped in the side-wall Si surface of the trench 33 (or opening) of the silicon substrate 404, and a p-type diffusion layer 55 is formed.

Subsequently, as shown in FIG. 22, an insulative material, such as a silicon oxide film ($SiO_2$ film), a silicon nitride film ($Si_3N_4$ film) or a titanium oxide (TiO) film, which has a lower refractive index than silicon (Si), is buried in the trenches 33 (or hole-like openings) formed in the above step, by, e.g. CVD or spin coating. Thereby, a device isolation insulation film 408 is formed. Thereafter, an insulative material is deposited on the device isolation insulation film 408 by, e.g. CVD, and an antireflection film 405 is formed over the entire bottom surface of the substrate.

Subsequently, through the same fabrication steps as in the first embodiment, the solid-state imaging device according to the present embodiment is manufactured.

<Advantageous Effects>

According to the above-described solid-state imaging device of the present embodiment and the manufacturing method thereof, at least the same advantageous effects (1) and (2) as described above can be obtained. In addition, according to the present embodiment, at least the following advantageous effect (3) can be obtained.

(3) Dark current can advantageously be reduced.

The solid-state imaging device according to the present embodiment further includes the p-type diffusion layer 55 which is provided in the semiconductor substrate 404 along the side wall of the device isolation insulation film 48.

Accordingly, as shown in FIG. 19C, since depletion at the interface between the silicon (Si) substrate 404 and the device isolation insulation film 408 can be prevented, dark current occurring due to, e.g. a crystal defect that is present at a boundary surface, can advantageously be reduced.

In this case, as shown in the Figure, it is preferable that the p-type diffusion layer 55 be formed continuously between the neighboring unit pixels 1. With this structure, the p-type diffusion layer 55 is formed without spacing between the neighboring unit pixels 1, and the p-type diffusion layer 55 not only has the effect of preventing dark current, as described above, but also has the effect of preventing diffusion between the n-type diffusion layer 403 that becomes the light-receiving region and the n-type diffusion layer 403 in the neighboring unit pixel 1.

[Third Embodiment (An Example in which an Insulation Film and a p-type Diffusion Layer are Offset and Provided)]

Next, referring to FIG. 23 to FIG. 31, a solid-state imaging device according to a third embodiment and a manufacturing method thereof are described. This embodiment relates to an example in which the device isolation insulation film 408 and p-type diffusion layer 55 are provided with an offset by a predetermined distance (d1 or d2) from the surface (front surface side) of the semiconductor substrate on which the signal scanning circuit unit is formed. A detailed description of the parts common to those in the first embodiment is omitted here.

<Cross-sectional Structure Example (1)>

Figure 23:
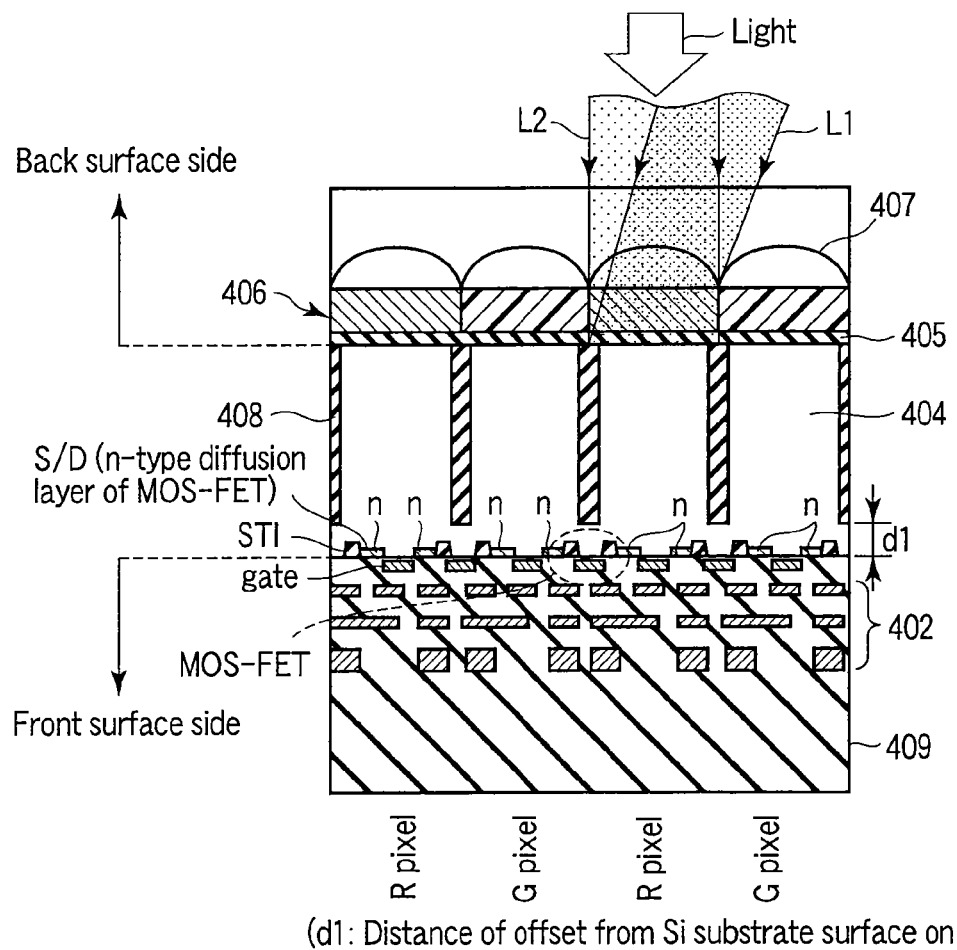
FIG. 23 is a cross-sectional view showing a cross-sectional structure example (1) of a unit pixel of a solid-state imaging device according to a third embodiment.

A cross-sectional structure shown in FIG. 23 differs from the first embodiment in that the device isolation insulation film 408 is provided in the semiconductor substrate 404 with an offset by a predetermined distance (d1) from the surface (front surface side) of the semiconductor substrate 404 on which the signal scanning circuit unit is formed.

In other words, the illustrated structure differs from the first embodiment in that the device isolation insulation film 408 between the neighboring unit pixels 1 is not formed on the silicon (Si) substrate 404 on the front surface side on which the signal scanning circuit unit is formed.

Further, as shown in the Figure, when the device isolation insulation film 408 is to be provided at the device isolation insulation boundary region of the unit pixels 1, if the device isolation insulation film 408 is provided to extend to the surface of the silicon (Si) substrate 404 on the front surface side on which the signal scanning circuit is formed, the area that can be occupied by the active elements, such as MOS-FETs, which are provided on the front surface side of the silicon substrate 404, would become very small. Consequently, many active elements, such as MOS-FETs, could not be formed in fine pixels.

Figure 24:
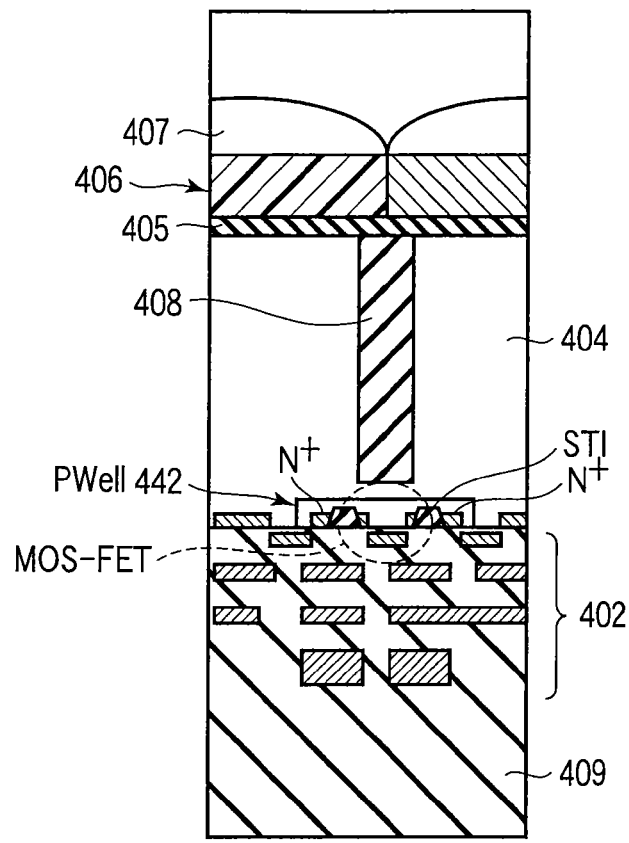
FIG. 24 is a cross-sectional view showing, in enlarged scale, the unit pixel in FIG. 23.

As shown in FIG. 24 in enlarged scale, an active element (MOS-FET), which is surrounded by a broken line, is composed of a gate electrode that is provided in the interlayer insulation film 409, a gate insulation film, and source/drain regions S/D (n-type diffusion layers) which are provided spaced apart in the silicon substrate 404 in a manner to sandwich the gate electrode. A device isolation insulation film STI is provided between active elements (MOS-FETs). Further, a P well 442 is provided in the semiconductor substrate 404 under the device isolation insulation film 408 in a manner to surround the drain S/D (n-type diffusion layer) and the device isolation insulation film STI.

In the present example, however, as shown in the Figure, the device isolation insulation film 408 is provided in the semiconductor substrate 404 with an offset by a predetermined distance (d1) from the surface (front surface side) of the semiconductor substrate 404 on which the signal scanning circuit unit is formed.

Thus, there is no restriction to the layout of the active element, such as a MOS-FET, which is formed in the unit pixel 1, and therefore fine pixels can be formed with no restriction. In the case of the present example, the predetermined distance d1 for the offset should preferably be set at, e.g. about 150 nn to about 1 μm.

<Manufacturing Method (1)>

Figure 25:
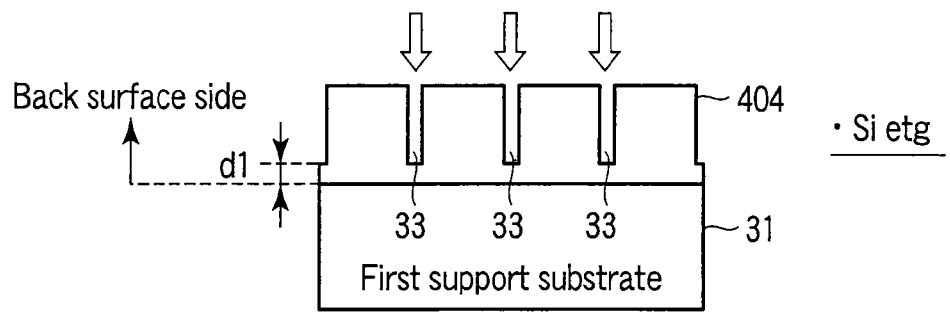
FIG. 25 is a cross-sectional view showing a fabrication step of the solid-state imaging device according to the third embodiment.
Figure 26:
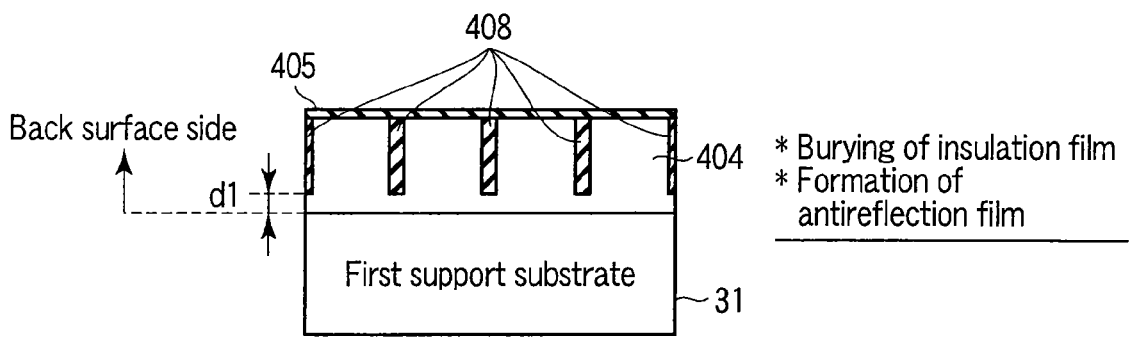
FIG. 26 is a cross-sectional view showing a fabrication step of the solid-state imaging device according to the third embodiment.

Next, referring to FIG. 25 and FIG. 26, a description is given of a method for manufacturing the above-described cross-sectional structure example (1).

To start with, as shown in FIG. 25, selective etching is performed by, e.g. photolithography, on the back-side surface of the silicon substrate 404, on which the light-receiving region is formed and which becomes the device isolation boundary of the unit pixel, and trenches 33 are formed in the silicon substrate 404 with an offset by a predetermined distance (d1) from the surface of the first support substrate 31 (the front-surface side of the silicon substrate 404). In this respect, this example differs from the first embodiment.

At the time of this step, for example, the application voltage at the time of etching is made lower than that in the first embodiment, or a predetermined reactant is selected. Thereby, the trench 33 with the offset of predetermined distance d1 is formed.

Subsequently, as shown in FIG. 26, an insulative material, such as a silicon oxide film ($SiO_2$ film) or a titanium oxide (TiO) film, which has a lower refractive index than silicon (Si), is buried in the trenches 33 (or hole-like openings) that are offset with the predetermined distance d1, by, e.g. CVD or spin coating. Thereby, a device isolation insulation film 408 is formed. Thereafter, an insulative material is deposited on the device isolation insulation film 408 by, e.g. CVD, and an antireflection film 405 is formed over the entire bottom surface of the substrate.

Subsequently, through the same fabrication steps as in the first embodiment, the solid-state imaging device shown in FIG. 23 is manufactured.

<Cross-sectional Structure Example (2)>

Figure 27:
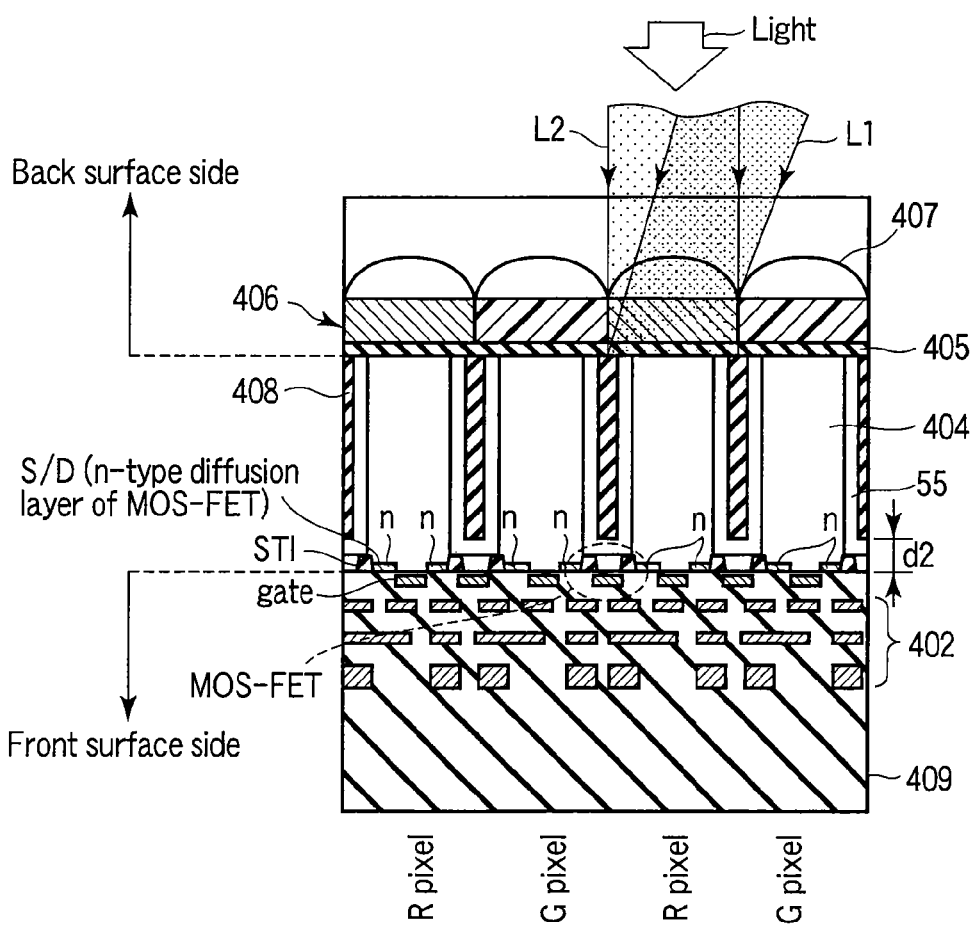
FIG. 27 is a cross-sectional view showing a cross-sectional structure example (2) of the unit pixel of the solid-state imaging device according to the third embodiment.

A cross-sectional structure shown in FIG. 27 differs from the first embodiment in that the p-type diffusion layer 55, in addition to the device isolation insulation film 408, is provided in the semiconductor substrate 404 with an offset by a predetermined distance (d2) from the surface (front surface side) of the semiconductor substrate 404 on which the signal scanning circuit unit is formed. In other words, the illustrated structure differs from the first embodiment in that the device isolation insulation film 408 and the p-type diffusion layer 55 between the neighboring unit pixels 1 are not formed on the silicon (Si) substrate 404 on the front surface side on which the signal scanning circuit unit is formed.

Figure 28:
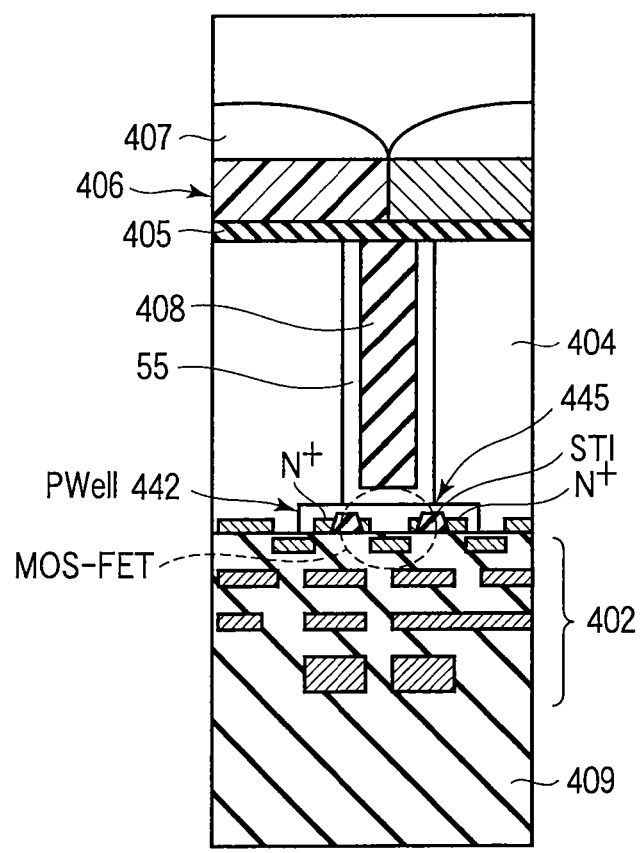
FIG. 28 is a cross-sectional view showing, in enlarged scale, the unit pixel in FIG. 27.

As shown in FIG. 28 in enlarged scale, an active element (MOS-FET) is provided in the offset region of the device isolation insulation film 408. In addition, the device isolation insulation film STI is provided between the active elements (MOS-FET).

Further, in the present example, as shown in FIG. 28, the p-type diffusion layer 55 and P well 442 are so provided as to be connected at a boundary 445.

Thus, at the time of photoelectric conversion, holes can advantageously be made to escape to the semiconductor substrate 404 side.

The predetermined distance d2 for the offset should preferably be set at, e.g. about 150 nn to about 1 μm.

<Manufacturing Method (2)>

Next, referring to FIG. 29 and FIG. 31, a description is given of a method for manufacturing the above-described cross-sectional structure example (2).

To start with, as shown in FIG. 29, like the above-described case, selective etching is performed by, e.g. photolithography, on the back-side surface of the silicon substrate 404, on which the light-receiving region is formed and which becomes the device isolation boundary of the unit pixel, and trenches 33 are formed in the silicon substrate 404 with an offset by a predetermined distance (d2) from the surface of the first support substrate 31 (the front-surface side of the silicon substrate 404).

Subsequently, as shown in FIG. 30, for example, by using a method such as solid-state diffusion, a p-type dopant such as boron (B) or indium (In) is doped in the side-wall Si surface of the trench 33 (or opening) of the silicon substrate 404 with the predetermined distance d2, and a p-type diffusion layer 55 is formed.

Subsequently, as shown in FIG. 31, an insulative material, such as a silicon oxide film ($SiO_2$ film) or a titanium oxide (TiO) film, which has a lower refractive index than silicon (Si), is buried in the trenches 33 (or hole-like openings) formed in the above step, by, e.g. CVD or spin coating. Thereby, a device isolation insulation film 408 is formed. Thereafter, an insulative material is deposited on the device isolation insulation film 408 by, e.g. CVD, and an antireflection film 405 is formed over the entire bottom surface of the substrate.

Subsequently, through the same fabrication steps as in the first embodiment, the solid-state imaging device shown in FIG. 27 is manufactured.

<Advantageous Effects>

According to the above-described solid-state imaging device of the present embodiment and the manufacturing method thereof, at least the same advantageous effects (1) to (3) as described above can be obtained. In addition, according to the present embodiment, at least the following advantageous effect (4) can be obtained.

(4) Since there is no restriction to the layout of the active element, such as a MOS-FET, which is formed in the unit pixel 1, fine pixels can be formed with no restriction.

When the device isolation insulation film 408 and p-type diffusion layer 55 need to be provided at the device isolation insulation boundary region of the unit pixels 1, if the device isolation insulation film 408 and p-type diffusion layer 55 are provided to extend to the surface of the silicon (Si) substrate 404 on the front surface side on which the signal scanning circuit is formed, the area that can be occupied by the active elements, such as MOS-FETs, which are provided on the front surface side of the silicon substrate 404, would become very small. Consequently, many MOS-FETs could not be formed in fine pixels.

In the structure of the present example, however, as shown in FIG. 23 and FIG. 27, the device isolation insulation film 408 and p-type diffusion layer 55 are provided in the semiconductor substrate 404 with an offset by a predetermined distance (d1, d2) from the surface (front surface side) of the semiconductor substrate 404 on which the signal scanning circuit unit is formed. In other words, in the structure of this example, the device isolation insulation film 408 and p-type diffusion layer 55 between the neighboring unit pixels 1 are not formed on the silicon (Si) substrate 404 on the front surface side on which the signal scanning circuit unit is formed.

Thus, there is no restriction to the layout of the active element, such as a MOS-FET, which is formed in the unit pixel 1, and therefore fine pixels can advantageously be formed with no restriction.

The predetermined distance d1, d2 for the offset should preferably be set at, e.g. about 150 nn to about 1 μm.

COMPARATIVE EXAMPLE

An Example in which a Device Isolation Insulation Film is not Included

Figure 32:
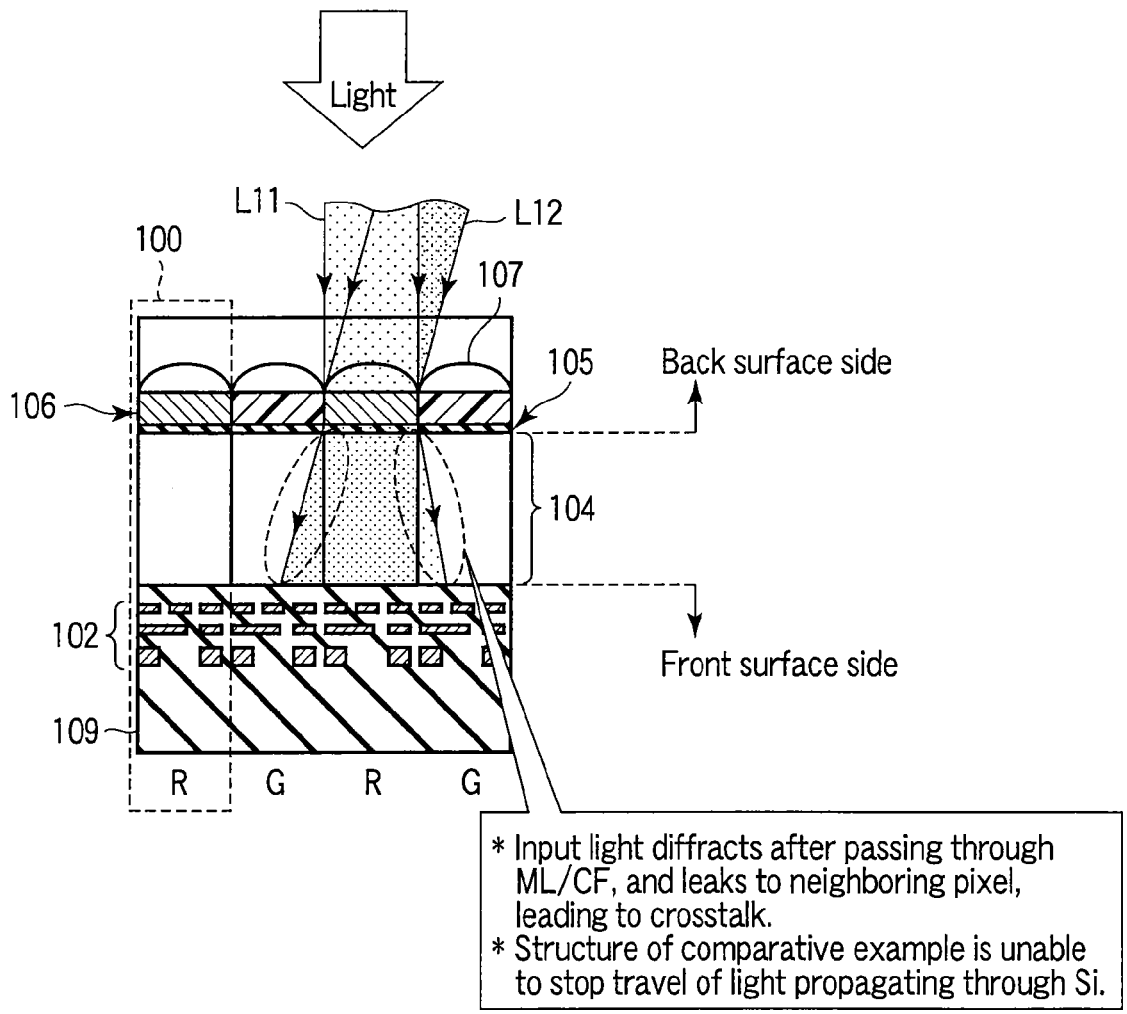
FIG. 32 is a cross-sectional view showing a cross-sectional structure example of a solid-state imaging device according to a comparative example.

Next, referring to FIG. 32, a description is given of a solid-state imaging device according to a comparative example for comparison with the solid-state imaging devices according to the first to third embodiments. This comparative example relates to a case in which a device isolation insulation film is not provided in the device isolation region.

As shown in the Figure, in the structure according to the comparative example, the device isolation insulation film shown in the above embodiments is not provided in the device isolation region.

Thus, in the solid-state imaging device according to the comparative example, incident light L11, L12, which is incident from the back side of the substrate, diffracts after passing through the ML/CF in the unit pixel 100, and leaks to the neighboring unit pixel, leading to crosstalk. As a result, disadvantageously, color mixing occurs, color reproducibility on the reproduced screen deteriorates, and the image quality decreases.

As described above, in the structure of the comparative example, since the device isolation insulation film shown in the above embodiments is not provided in the device isolation region, it is not possible to stop the travel of light L11, L12 propagating through the silicon (Si) substrate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
   a semiconductor substrate; and
   a pixel region formed in the semiconductor substrate and including a photoelectric conversion unit and a signal scanning circuit unit the pixel region including
   a matrix of unit pixels disposed on the semiconductor substrate,
   a device isolation insulation film provided on a boundary part between neighboring ones of the unit pixels, the device isolation insulation film being provided in and vertically to the semiconductor substrate with an offset from a front surface of the semiconductor substrate where the signal scanning circuit unit is formed and reaching a back surface of the semiconductor substrate,
   a first diffusion layer of a second conductivity type provided in the semiconductor substrate along a sidewall of the device isolation insulation film,
   a second diffusion layer of the second conductivity type formed on the front surface of the semiconductor substrate,
   a MOSFET formed in the second diffusion layer and under the device isolation insulation film, the MOSFET disposed on a line elongated from the device isolation insulation film vertically formed and apart from the device isolation film and the semiconductor substrate,
   wherein the first diffusion layer is in contact with the second diffusion layer, and
   a center of the first diffusion layer in a width direction thereof is positioned near a center of the second diffusion layer in the width direction.

2. The device according to claim 1, wherein the photoelectric conversion unit includes a photodiode which is provided in the semiconductor substrate and includes a third diffusion layer of a first conductivity type which constitutes a signal charge accumulation region.

3. The device according to claim 1, wherein the device isolation insulation film is disposed in a lattice-like plan-view shape in a manner to surround each of the unit pixels.

4. The device according to claim 1, wherein the device isolation insulation film is disposed in a discontinuous hole-like plan-view shape in a manner to surround each of the unit pixels.

5. The device according to claim 1, further comprising a vertical shift register which selects the unit pixels on a row-by-row basis.

6. The device according to claim 1, further comprising an analog-digital conversion circuit which converts an analog signal, which is input from the unit pixels, to a digital signal.

7. The device according to claim 1, wherein the photoelectric conversion unit receives light from a back surface side of the semiconductor substrate.

8. The device according to claim 1, further comprising a driving circuit region which is configured such that a device driving circuit for driving the signal scanning circuit unit is disposed on the semiconductor substrate.

9. The device according to claim 1, wherein the device isolation insulation film is provided in a manner to surround the unit pixels.

10. The device according to claim 1, wherein a center of the first diffusion layer in the width direction is positioned near the center of the MOSFET in the width direction.

11. A method of manufacturing a solid-state imaging device including unit pixels, comprising:
    attaching a first support substrate on a front surface of a semiconductor substrate on a side on which a signal scanning circuit is formed;
    reducing a thickness of a back surface of the semiconductor substrate on a side opposite to the side on which the signal scanning circuit is formed;
    forming, in the semiconductor substrate on the back surface side, a trench which defines a device isolation region;
    forming a device isolation insulation film by burying an insulative material in the trench;
    attaching a second support substrate on the back surface side of the semiconductor substrate;
    removing the first support substrate;
    forming a signal scanning circuit unit on the front-side surface of the semiconductor substrate;
    removing the second support substrate; and
    forming a light-receiving surface on the back-side surface of the semiconductor substrate,
    wherein the device isolation insulation film is vertically provided in the semiconductor substrate with an offset from the front surface of the semiconductor substrate and reaches the back surface of the semiconductor substrate.

12. The method according to claim 11, further comprising doping a dopant in a semiconductor surface on a side wall in the trench, and forming an impurity diffusion layer.

13. The method according to claim 11, wherein when the trench which defines the device isolation region is formed, the trench is offset in the semiconductor substrate with a predetermined distance from a surface of the first support substrate.

14. The method according to claim 11, wherein a plan-view arrangement of the device isolation insulation film is such a lattice-shaped arrangement as to surround the unit pixels.

15. The method according to claim 11, wherein when the trench for forming the device isolation region is formed, a plan-view shape thereof is formed as a lattice-like shape in a manner to surround the unit pixels.

16. The method according to claim 11, wherein when the trench for forming the device isolation region is formed, a plan-view shape thereof is formed as a discontinuous hole-like shape in a manner to surround a boundary part of each of the unit pixels.

17. The method according to claim 11, wherein the trench defines the device isolation region in a manner to surround the unit pixels.

* * * * *